United States Patent
Mezghani et al.

(10) Patent No.: US 8,463,586 B2
(45) Date of Patent: Jun. 11, 2013

(54) MACHINE, PROGRAM PRODUCT, AND COMPUTER-IMPLEMENTED METHOD TO SIMULATE RESERVOIRS AS 2.5D UNSTRUCTURED GRIDS

(75) Inventors: Mokhles M. Mezghani, Dhahran (SA); Larry S. Fung, Dhahran (SA)

(73) Assignee: Saudi Arabian Oil Company (SA)

( * ) Notice: Subject to any disclaimer, the term of this patent is extended or adjusted under 35 U.S.C. 154(b) by 361 days.

(21) Appl. No.: 12/820,936

(22) Filed: Jun. 22, 2010

(65) Prior Publication Data
US 2011/0313745 A1    Dec. 22, 2011

(51) Int. Cl.
*G06G 7/48* (2006.01)

(52) U.S. Cl.
USPC .................. 703/10; 702/6; 345/420

(58) Field of Classification Search
USPC ........................................... 703/10
See application file for complete search history.

(56) References Cited

U.S. PATENT DOCUMENTS

| | | | |
|---|---|---|---|
| 5,321,612 A | 6/1994 | Stewart |
| 5,710,726 A | 1/1998 | Rowney |
| 5,729,451 A | 3/1998 | Gibbs |
| 5,740,342 A | 4/1998 | Kocberber |
| 6,078,869 A | 6/2000 | Gunasekera |
| 6,128,577 A | 10/2000 | Assa |
| 6,278,948 B1 | 8/2001 | Jorgensen |
| 6,282,452 B1 | 8/2001 | DeGuzman |
| 6,424,918 B1 | 7/2002 | Jorgensen |
| 6,430,507 B1 | 8/2002 | Jorgensen |
| 6,502,037 B1 | 12/2002 | Jorgensen |
| 6,675,097 B2 | 1/2004 | Routh |
| 6,810,370 B1 | 10/2004 | Watts |
| 6,823,297 B2 | 11/2004 | Jenny et al. |
| 6,826,520 B1 | 11/2004 | Khan et al. |
| 6,907,392 B2 | 6/2005 | Bennis |
| 6,928,399 B1 | 8/2005 | Watts et al. |
| 6,980,940 B1 | 12/2005 | Gurpinar |

(Continued)

FOREIGN PATENT DOCUMENTS

| | | |
|---|---|---|
| EP | 0881357 | 12/1998 |
| WO | WO2009075945 | 6/2009 |

OTHER PUBLICATIONS

Branets et al, "Challenges and Technologies in Reservoir Modeling", Communications in Computational Physics, vol. 6, No. 1, pp. 1-23.*
Gunasekera et al, "The Generation and Application of K-Orthogonal Grid Systems", SPE 37998, 1997.*
Shuttleworth et al, "Partitioners for Parallelizing Reservoir Simulations", SPE 119130, Feb. 2-4, 2009.*

(Continued)

*Primary Examiner* — Mary C Jacob
(74) *Attorney, Agent, or Firm* — Bracewell & Giuliani LLP

(57) ABSTRACT

Example embodiments utilize machines to model reservoir geometry having geological layers as 2.5D unstructured grids. Example embodiments include program products to simulate a reservoir by generating a reservoir data system, performing a numerical fluid flow simulation, and visualizing the simulation. Data system embodiments include data structures to model a reservoir geometry as laterally unstructured two-dimensional (2D) grids and associated layer depths defining z-lines to thereby define a 2.5D unstructured grid, including datasets for: vertices of the grid cells for the future grid top and bottom surfaces, a number and listing of vertices for each grid cell, cell center coordinates, and vertex adjacency information using a compressed sparse row format. Computer-implemented methods include projecting external and internal boundaries onto a future grid surface; generating 2D unstructured, e.g., Voronoi, grids, for the top and bottom surfaces; and generating z-lines of depths corresponding to reservoir layers to thereby generate 2.5D unstructured grids.

20 Claims, 19 Drawing Sheets

U.S. PATENT DOCUMENTS

| | | | |
|---|---|---|---|
| 6,993,433 | B2 | 1/2006 | Chavarria |
| 7,006,959 | B1 | 2/2006 | Huh et al. |
| 7,047,165 | B2 | 5/2006 | Balaven |
| 7,177,764 | B2 | 2/2007 | Stone |
| 7,225,324 | B2 | 5/2007 | Huppenthal |
| 7,277,836 | B2 | 10/2007 | Netemeyer |
| 7,379,853 | B2 | 5/2008 | Middya |
| 7,496,488 | B2 | 2/2009 | Jenny et al. |
| 7,526,418 | B2 | 4/2009 | Pita et al. |
| 7,627,461 | B2 | 12/2009 | Guyaguler |
| 2002/0049575 | A1 | 4/2002 | Jalali et al. |
| 2002/0177986 | A1 | 11/2002 | Moeckel |
| 2003/0132934 | A1 | 7/2003 | Fremming |
| 2003/0201098 | A1 | 10/2003 | Karanikas |
| 2006/0085174 | A1 | 4/2006 | Hemanthkumar |
| 2006/0235667 | A1 | 10/2006 | Fung |
| 2006/0277013 | A1 | 12/2006 | Bennis |
| 2006/0282243 | A1 | 12/2006 | Childs et al. |
| 2007/0073527 | A1 | 3/2007 | Flandrin |
| 2012/0215513 | A1* | 8/2012 | Branets et al. ............ 703/10 |

OTHER PUBLICATIONS

Formaggia, "Data Structures for Unstructured Mesh Generation", Chapter 14, CRC Press LLC (1999).

Heinemann et al., "Modeling Reservoir Geometry With Irregular Grids", SPE Reservoir Engin. (May 1991), pp. 225-232.

PCT International Search Report and Written Opinion (PCT/US2011/041160), dated May 10, 2012.

Schoof, L.A. and Victor R. Yarberry, "EXODUS II A Finite Element Data Model", SAND92-2137, Sandia National Laboratories, 1995.

VTK format, www.vtk.org, Printed Sep. 28, 2010.

ABAQUS format, www.abaqus.com. Printed Sep. 28, 2010.

Goldthorpe, W.H., Chow, Y.S., "Unconventional Modeling of Faulted Reservoirs: A Case Study", SPE 13526, Feb. 10-13, 1985, Dallas, Texas.

Kydland, T., Haugan, P.M., Bouquet, G., Havig, S.O., "Application of Unconventional Techniques in Constructing an Integrated Reservoir Simulation Model for Troll Field", SPEJ, Aug. 1988.

Aurenhammer, Franz, "Voronoi Diagrams—A Survey of a Fundamental Geometric Data Structure", ACM Computing Surveys, Sep. 1991, vol. 23 No. 3.

Vinsome, P.K.W. "Orthomin, an Iterative Method for Solving Spare Sets of Simultaneous Linear Equations", SPE 5729, 1976, pp. 149-159, SPE.

Saad, Y., et al. "GMRES: A Generalized Minimal Residual Algorithm for Solving Nonsymmetric Linear Systems", SIAM J. Sci. Stat. Comput., Jul. 1986, pp. 856-869, vol. 7, No. 3.

Holmes, J.A., "Enhancements to the Strongly Coupled, Fully Implicit Well Model: Wellbore Crossflow Modeling and Collective Well Control" SPE 12259 the 7th Reservoir Simulation Symposium, Nov. 1983, pp. 255-266.

Wallis, J.R. et al., "Constrained Residual Acceleration of Conjugate Residual Methods", SPE 13536, the 8th Reservoir Simulation Symposium, Feb. 1985, pp. 415-428.

Al-Shallan, T.M., et al., "Modeling of Faults and Pinchouts in Parallel Environment", SPE SA 43, May 2004, pp. 1-8, Saudi Arabian Section.

Fung, L.S.K., et al., "Reservoir Simulation With a Control-Volume Finite-Element Method", SPE Reservoir Engineering, Aug. 1992, pp. 349-357.

Fung, L.S.K., et al., "Hy-brid-CVFE Method for Flexible-Grid Reservoir Simulation", SPE Reservoir Engineering, Aug. 1994, pp. 188-194.

Fung, L.S.K., et al., "Simulation of Block-to-Block Processes in Naturally Fractured Reservoirs", SPE Reservoir Engineering, Nov. 1991, pp. 477-484.

Dogru, A.H., et al., "A Massively Parallel Reservoir Simulator for Large Scale Reservoir Simulation", SPE 51886, 1999 SPE Reservoir Simulation Symposium, Houston, Texas, Feb. 1999, pp. 1-28.

Dogru, A.H., et al., "Simulation of Super K Behavior in Ghawar by a Multi-Million Cell Parallel Simulator", SPE 68066, Middle East Oil Show, Bahrain, Mar. 17-20, 2001, pp. 1-10.

Stackel, A.W., et al., "An Example Approach to Predictive Well Management in Reservoir Simulation", Journal of Petroleum Technology, Jun. 1981, pp. 311-318.

Wijesinghe, A.M., et al., "A Comprehensive Well Management Program for Black Oil Reservoir Simulation", SPE 12260, SPE Symposium on Reservoir Simulation, San Francisco, California, Nov. 1983, pp. 267-284.

Wallace, D.J., et al., "A Reservoir Simulation Model with Platform Production/Injection Constraints for Development Planning of Volatile Oil Reservoirs", SPE 12261, Reservoir Simulation Symposium, San Francisco, California, Nov. 1983, pp. 285-296.

Mohammed, D.A., et al., "An Efficient Reservoir-Coupled Gas Gathering System Simulator", SPE 8333, SPE Annual Technical Conference and Exhibit, Las Vegas, Nevada, Sep. 23-26, 1979, pp. 1-10.

Mrosovsky, I., et al., "Construction of a Large Field Simulator on a Vector Computer", Journal of Petroleum Technology, Dec. 1980, pp. 2253-2264.

Podio, A.L., et al., "Total Well Management Aids Production of Beam Pumped Wells", Petroleum Engineer International, Oct. 1995, pp. 27, 29, 31-32, vol. 68, No. 10, Hart Publication, US.

Yao, Kaifeng, et al., "Hydrocarbon Reservoir Prediction Using Support Vector Machines", Adv. in Neural Networks, Intnl Sym. on Neural Networks Prec., Aug. 2004, pp. 537-542, vol. 1, Springer-Verlag Berlin, Germany.

Yeten, Burak, et al., "Optimization of Nonconventional Well Type, Location and Trajectory", SPE 77565, SPE Annual Technical Conference and Exhibition, San Antonio, Texas, Sep. 29-Oct. 2, 2002, pp. 1-14.

Abate, Jason, et al., "Parallel Compositional Reservoir Simulation on a Cluster of PCs", The International Journal of High Performance Computering Applications, Dec. 21, 1998, pp. 1-10.

Wu, Yu-Shu, et al., "An Efficient Parallel-Computing Method for Modeling Nonisothermal Multiphase Flow and Multicomponent Transport in Porous and Fractured Media", Advances in Water Resources, Mar. 2002, pp. 243-261, vol. 25 Issue 3, Elsevier Science Ltd.

Litvak M.L., "New Procedure for the Phase-Equilibrium Computations in the Compositional Reservoir Simulator", SPE 25252, SPE Advanced Technology Series, 1994, pp. 113-121, vol. 2, No. 2.

Dogru A.H. et al., "A Parallel Reservoir Simulator for Large Scale Reservoir Simulation", SPE Advanced Technology Series, Feb. 2002, pp. 11-23.

Dogru, A.H., et al., "Megacell Reservoir Simulation", SPE Advanced Technology Series, May 2000, pp. 54-60, vol. 52, No. 5.

Coats, Keith H., "An Equation of State Compositional Model", Society of Petroleum Engineers Journal, Oct. 1980, pp. 363-376.

Coats, Keith H., "Compositional and Black Oil Reservoir Simulation", SPE 29111, SPE Symposium on Reservoir Simulation, San Antonio, Texas, Feb. 12-15, 1995, pp. 149-162.

Wang, P., et al., "A Fully Implicit Parallel EOS Compositional Simulator for Large Scale Reservoir Simulation", SPE 51885, SPE Reservoir Simulation Symposium, Houston, Texas, Feb. 14-17, 1999, pp. 1-9.

Wang, P., et al., "Proper Use of Equations of State for Compositional Reservoir Simulation", SPE 69071, Jul. 2001, pp. 74-80.

Helman, C., "What does a company making $250 billion a year do for an encore?" Forbes, http://www.forbes.com/forbes/2008/1124/044_print.ntml, Nov. 24, 2008.

"Saudi Aramco Completes First Giga-Cell Reservoir Simulation Run" http://www.rigzone.com/news/article.asp?a, Saudi Aramco, Nov. 26, 2008.

Aziz, Khalid, et al., "Petroleum Reservoir Simulation", 1979, pp. 125-199, 303-349, 357-375, Applied Science Publishers LTD, London.

Ertekin, Turgay, et al., "Basic Applied Reservoir Simulation" 2001, pp. 1-10, 105-178, 218-367, 391-394, Society of Petroleum Engineers Inc., Richardson, Texas.

* cited by examiner

MULTIBRANCHED

FORKED

LATERALS INTO HORIZONTAL HOLE

LATERALS INTO VERTICAL HOLE

STACKED LATERALS

DUAL-OPPOSING LATERALS number of cells = 17
number of vertices = 32

113 → x and y coordinates of the vertices:
$(x_1,y_1);(x_2,y_2);(x_3,y_3);(x_4,y_4); \ldots ;(x_{30},y_{30});(x_{31},y_{31});(x_{32},y_{32})$ 114 → number of vertices per cell:
5 6 5 6 6 5 6 5 5 4 5 4 4 4 4 5 4 5

115 → vertices id list:
(1 9 10 5 2) (9 21 22 17 13 10) (21 29 30 27 22) (2 5 7 8 6 3)
(30 31 28 26 25 27) (3 6 11 12 4) (11 16 20 23 24 12)
(31 32 24 23 28) (7 5 10 13 14) (13 17 18 14) (17 22 27 25 18)
(7 14 15 8) (14 18 19 15) (18 25 26 19) (6 8 15 16 11)
(15 19 20 16) (19 26 28 23 20)

number of cells = 17
number of vertices = 32 xadj
1 3 6 9 11 14 17 20 23 26 29 32 35 38 42 46 49
52 56 60 63 66 69 72 75 78 81 84 87 89 92 95 97 adjncy
2 9 1 3 5 2 4 6 3 1 2 2 7 10 3 8 11 5 8 14 6 7 15 1 10 21 5 9 13 6 12 16 4
11 24 10 14 17 7 13 15 18 8 14 16 19 11 15 20 13 18 22 14 17 19 25 15
18 20 26 16 19 23 9 22 29 17 21 27 20 24 28 12 23 32 18 26 27 19 25 28
22 25 30 23 26 31 21 30 27 29 31 28 30 32 24 31

Example: vertex 16
xadj[16] to xadj[17]-1= (46 47 48): pointer to the adjacency list of vertex 16
Adjncy[46] to adjncy[48] = (11 15 20): the adjacency list of vertex 16

MACHINE, PROGRAM PRODUCT, AND COMPUTER-IMPLEMENTED METHOD TO SIMULATE RESERVOIRS AS 2.5D UNSTRUCTURED GRIDS

BACKGROUND OF THE INVENTION

1. Field of the Invention

The present invention relates generally to computerized simulation of hydrocarbon reservoirs, and, more particularly, to a method and data system of 2.5D unstructured grid storage, calculation, and visualization.

2. Description of Related Art

[1] A subterranean geologic body or formation contains multi-phase, multi-component fluids, and accordingly a petroleum reservoir may contain oil, natural gas, water and several constituent compounds, that may be modeled to predict the fluid flow from a reservoir, which is also known as reservoir simulation. Reservoir simulation models may be run before or after a well is drilled to determine production rate, etc. for the various methods.

Current reservoir modeling techniques create a numerical grid of the reservoir comprised of a plurality of grid cells, and process data in the finite volume of each grid cell. Because reservoirs can be complex, and grid cells can number in the millions, the simulation models can take days. Accordingly, Saudi Aramco's POWERS™ program was created to streamline data processing using parallel computing. Parallel computing, as performed by the POWERS program, divides the numerical grid into a plurality of domains, with each domain consisting of a plurality of grid cells. If the numerical grid is a structured grid, meaning each grid cell can be described the same, i.e., each inner vertex is incident to a fixed number of cells and each cell is defined by a fixed number of faces and edges. Structured grids may use Cartesian coordinates (I,J, K), FIGS. 1 and 2, or some other similar mapping method to locate grid cells for data processing, such as corner point geometry format shown in FIGS. 3 and 4.

To run the simulations using structured grids, rock properties, described using geologic models (porosity, permeability, etc.) as well as the geometry of the rock formation and data related to the well bore, are read into each computer. Because the domain is sub-divided into several finite volumes, or grid cells, conservation equations of mass, momentum, and energy are then constructed for each grid cell. These balance equations represent the discrete time rate of change of these quantities stored in the grid block due to the inter-block fluxes and sources and sinks of the quantities due to the physical and chemical processes being modeled, and are accordingly a set of discrete non-linear partial differential equations involving complex functions. Finally, using the mapping method for the grid, each computer can arrange for cross talk with other computers to simulate flow through the domains.

Unfortunately, reservoirs are of a sedimentary origin and have multiple layers that have thicknesses and depth variations throughout, which do not neatly follow the pattern of a structured grid. For example, a layer can disappear locally due to lack of deposition or subsequent erosion, which is known as a pinch-out. Also, uplifting (the raising of the earth's crust) and subsidence (the lowering of the earth's crust) over geologic time can lead to faulting and fracturing of the layers. In addition to the complexity of the reservoir layers, complex wells may be drilled into the reservoirs to extracts fluids from them or to inject fluids into them for pressure maintenance or enhance-oil-recovery operations, i.e., these wells may be multi-branched as shown in FIG. 5. Conventional reservoir simulators that use Cartesian grids or corner point geometry (CPG) grids for reservoir simulation have difficulty, with complex geological features (including faults, pinch-outs, and, erosion) and complex well geometries (including deviated or multi-lateral wells) as shown in FIG. 6, and may generate smaller grid dimensions to account for these features. With conventional techniques, smaller grid dimensions result in more accurate approximations of the reservoir, but at a cost of larger datasets (i.e., more data points). In addition, as shown in FIG. 7, local grid refinement (LGR) may be used to account for geological features when using structured grids. LGR involves splitting particular cells into multiple, smaller cells to better model the underlying continuous real geometry, at a cost of complexity and more data points. To reduce complexity of the grid, unstructured grids, built to represent the geologic layers and well geometry would be better.

To create unstructured grids, oil or gas reservoirs are subdivided into non-uniform elementary finite-volumes, i.e., grid cells or grid blocks. These grid cells can have variable numbers of faces and edges that are positioned to honor physical boundaries of geological structures and well geometry embedded within the reservoir. Accordingly, these maps may be very complex. Examples of unstructured gridding methods includes Voronoi diagrams, i.e., a grid where each cell has faces and edges that are closer to one Voronoi site or point than any other Voronoi site or point. While unstructured grids more accurately reflect the geological features of the geological body, in order to perform unstructured grid simulation using parallel processing techniques, the global coordinate system, e.g., (I,J,K) Cartesian indexing, must be replaced with a global hash table, accessible by the computer processing each domain, to arrange for cell and domain crosstalk. Unfortunately, the global hash table for a model with, e.g., millions of cells, can overwhelm the memory of for each of the parallel computers.

In addition to the problems with prior art reservoir grids, simulating reservoirs having multi-lateral wells require more data input and use more complex algorithms, and simulation models for this types of production methods can be very cumbersome—even using the POWERS™ system. The computational complexity of these equations is further complicated by geological model size is typically in the tens of million to hundreds of million of grid cells. Since finding a solution to millions of partial differential equations is computationally expensive, reservoir simulation models are usually built at a coarser scale than the geologic model via a data process known as upscaling, i.e. the averaging of rock properties for a plurality of grid cells. While computationally more efficient, upscaling renders the simulation model less accurate (and the upscaling makes the inaccuracy of the structured grid models more pronounced).

Therefore, the machine, methods, and program products of this invention constitute the enabling technology to process a 2.5 dimensional unstructured grids for complex reservoirs and multi-lateral well simulations to more accurately approximate well and geological features and reduce the computational complexity of the simulation.

SUMMARY OF THE INVENTION

Applicants recognize one or more sources of problems with these prior art approaches. Applicants also recognize a need for more efficient methods, program products, and machines, for describing and modeling layered reservoirs, including modeling techniques and data structures with fewer data points and improved accuracy. Applicants recognize the potential of unstructured, e.g., fully unstructured in two dimensions, grids in reservoir simulation to completely model a reservoir with fewer data points than either a traditional structured grid or a hybrid structured-unstructured grid. In addition, Applicants recognize advantages in the nature of reservoir formation, i.e., through deposits resulting in layers, for 2.5D unstructured grids.

Accordingly, a machine adapted to supply 2.5 dimension simulations is described herein. An embodiment of the machine comprises: a first computer server associated with a data pre-processor defining a pre-processing server, the pre-processing server having a processor and non-transitory memory and being adapted to send and receive data; a second computer server associated with computer storage and defining a file server; the file server having non-transitory file server memory and being adapted to send and receive data; a computer program product stored on the memory and including instructions that when executed by the processor cause the pre-processing server to perform a process of generating a grid and a process of encoding the grid to be stored on the file server, the instructions comprising the steps of: projecting static properties of the reservoir, including external and internal boundaries, onto a top surface of a future grid, constructing a 2D unstructured grid along the top surface of the future grid using static properties of the reservoir, the 2D unstructured grid having cells and the cells having vertexes defining the cell boundaries, reconstructing the 2D unstructured grid along a bottom surface of the future grid; constructing a vertical line the thickness of the reservoir through the future grid, to join the corresponding vertexes in the 2D unstructured grids on the top and bottom surfaces; creating markers along the vertical line, the markers corresponding to each layer in the reservoir and being defined using a location of each layer's horizon; duplicating vertexes on the top and bottom layers when a vertical fault line is to be modeled, the duplicated vertexes generating parallel vertical lines, and the parallel vertical lines having different markers thereon; copying the 2D, unstructured grid created for the top layer to each reservoir layer, the 2D unstructured grid being located at each marker to thereby create a 2.5 D grid; and assigning each grid cell vertex and each grid cell an index and storing each grid cell and grid cell index in memory using compressed sparse row format.

A computer program product adapted to supply 2.5 dimension simulations is also described herein. An embodiment of a computer program product, stored in non-transitory computer memory, operable on a computer, comprises a set of instructions that, when executed by the computer, cause the computer to perform a process of generating a grid and a process of encoding the grid to be stored on the file server, the instructions comprising the steps of: projecting static properties of the reservoir, including external and internal boundaries, onto a top surface of a future grid, constructing a 2D unstructured grid along the top surface of the future grid using static properties of the reservoir, the 2D unstructured grid having cells and the cells having vertexes defining the cell boundaries, reconstructing the 2D unstructured grid along a bottom surface of the future grid; constructing a vertical line the thickness of the reservoir through the future grid, to join the corresponding vertexes in the 2D unstructured grids on the top and bottom surfaces; creating markers along the vertical line, the markers corresponding to each layer in the reservoir and being defined using a location of each layer's horizon; duplicating vertexes on the top and bottom layers when a vertical fault line is to be modeled, the duplicated vertexes generating parallel vertical lines, and the parallel vertical lines having different markers thereon; copying the 2D, unstructured grid created for the top layer to each reservoir layer, the 2D unstructured grid being located at each marker, to thereby create a 2.5D grid; and assigning each grid cell vertex and each grid cell an index and storing each grid cell and grid cell index in memory using compressed sparse row format.

The invention also comprises a computer-implemented method for generating grids. An embodiment of the computer implemented method causing a computer as a pre-processing server to perform a process perform a process of generating a grid and a process of encoding the grid to be stored on the file server, the instructions comprising the steps of: projecting static properties of the reservoir, including external and internal boundaries, onto a top surface of a future grid, constructing a 2D unstructured grid along the top surface of the future grid using static properties of the reservoir, the 2D unstructured grid having cells and the cells having vertexes defining the cell boundaries, reconstructing the 2D unstructured grid along a bottom surface of the future grid; constructing a vertical line the thickness of the reservoir through the future grid, to join the corresponding vertexes in the 2D unstructured grids on the top and bottom surfaces; creating markers along the vertical line, the markers corresponding to each layer in the reservoir and being defined using a location of each layer's horizon; duplicating vertexes on the top and bottom layers when a vertical fault line is to be modeled, the duplicated vertexes generating parallel vertical lines, and the parallel vertical lines having different markers thereon; copying the 2D, unstructured grid created for the top layer to each reservoir layer, the 2D unstructured grid being located at each marker, to thereby create a 2.5D grid; and assigning each grid cell vertex and each grid cell an index and storing each grid cell and grid cell index in memory using compressed sparse row format.

Other embodiments of the computer-implemented method include: generating a two-dimensional (2D) unstructured grid for the top surface of the reservoir, which comprises the steps of: determining a plurality of cell centers responsive to the predetermined grid density and the projected external and internal boundaries of the reservoir; generating a triangulation for the plurality of cell centers; partitioning the top surface of the reservoir into a plurality of convex polygons defining grid cells responsive to the determined triangulation; and determining a plurality of vertices responsive to the grid cells responsive to the partitioning so that the top surface grid is completely defined by x and y coordinates of the vertices of the plurality of grid cells of the gridded surface, the number of vertices per grid cell, and vertices associated with each grid cell.

As one skilled in the art will appreciate, conventional reservoir simulators are based on three-dimensional (3D) structured grids and generally use Cartesian grids (see, e.g., FIGS. 1 and 2) or corner point geometry (CPG) grids (see, e.g., FIGS. 3 and 4) for reservoir simulation. These gridding methods are based on a fixed number of hexahedrons, i.e., six-sided blocks, in three coordinate directions. See, e.g., FIG. 2. Applicants recognize one or more sources of problems with these prior art approaches. For example, traditional gridding techniques, e.g., Cartesian and corner point geometry (CPG) grids, have difficulty with complex geological features, such as, faults, pinch-outs, inclined beddings, aquifers, erosion, coarsening, fractures, multiple reservoirs, reservoir boundaries, and other complex features as understood by those skilled in the art. Moreover, traditional gridding techniques have, for example, difficulty with complex well geometries, such as, vertical wells, horizontal wells, deviated wells, multi-lateral wells, forked wells, and segmented wells. See, e.g., FIG. 5.

BRIEF DESCRIPTION OF THE DRAWINGS

So that the manner in which the features and advantages of the invention, as well as others, which will become apparent, can be understood in more detail, a more particular description of the invention briefly summarized above can be had by reference to the embodiments thereof, which are illustrated in the appended drawings, which form a part of this specification. It is to be noted, however, that the drawings illustrate only various embodiments of the invention and are therefore not to be considered limiting of the invention's scope as it can include other effective embodiments as well.

DETAILED DESCRIPTION

Although the following detailed description contains many specific details for purposes of illustration, it is understood that one of ordinary skill in the art will appreciate that many examples, variations and alterations to the following details are within the scope and spirit of the invention. Accordingly, the exemplary embodiments of the invention described herein are set forth without any loss of generality to, and without imposing limitations thereon, the claimed invention.

Figure 8:
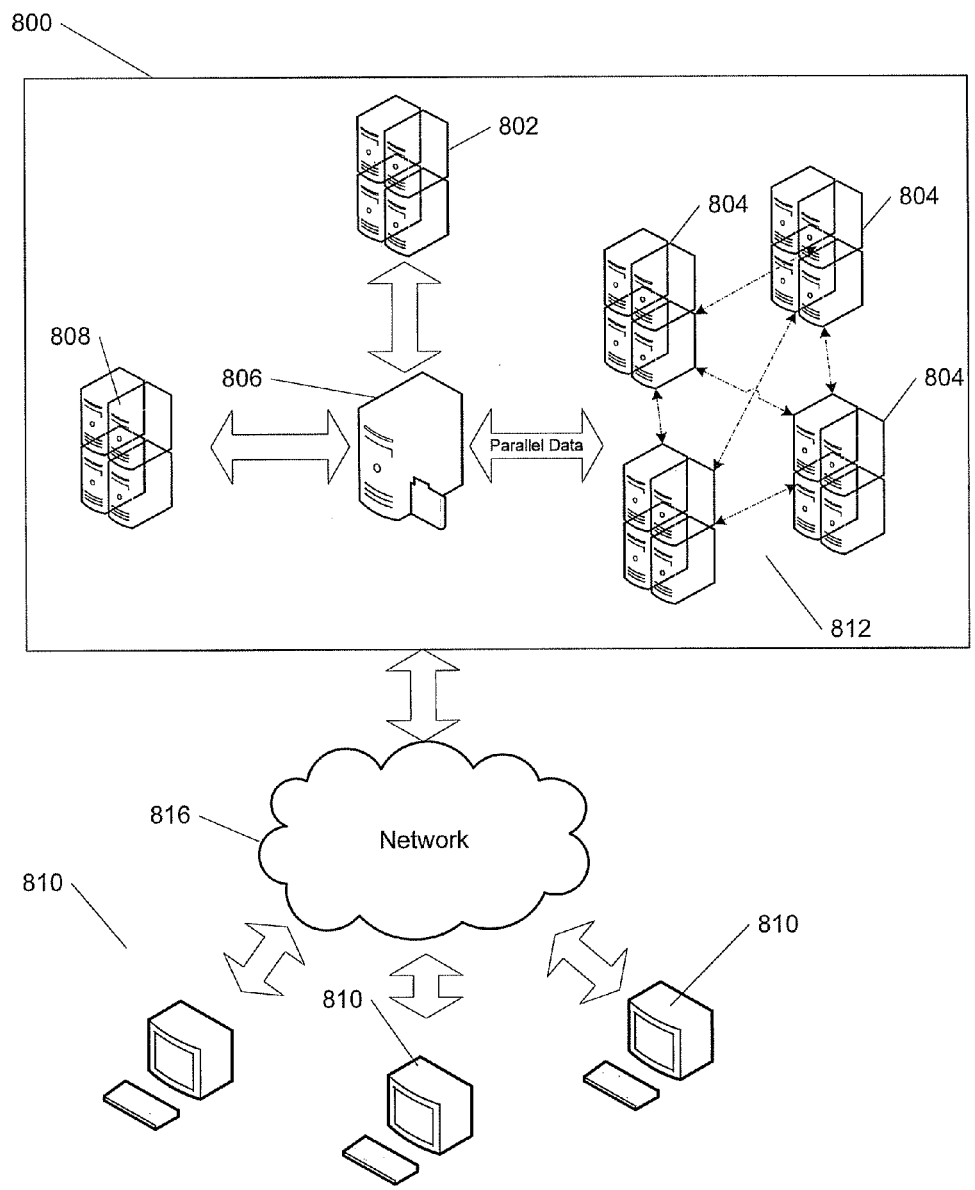
FIG. 8 is a diagram of a distributed network for processing the simulation using parallel computing according to an embodiment of the invention.
Figure 9:
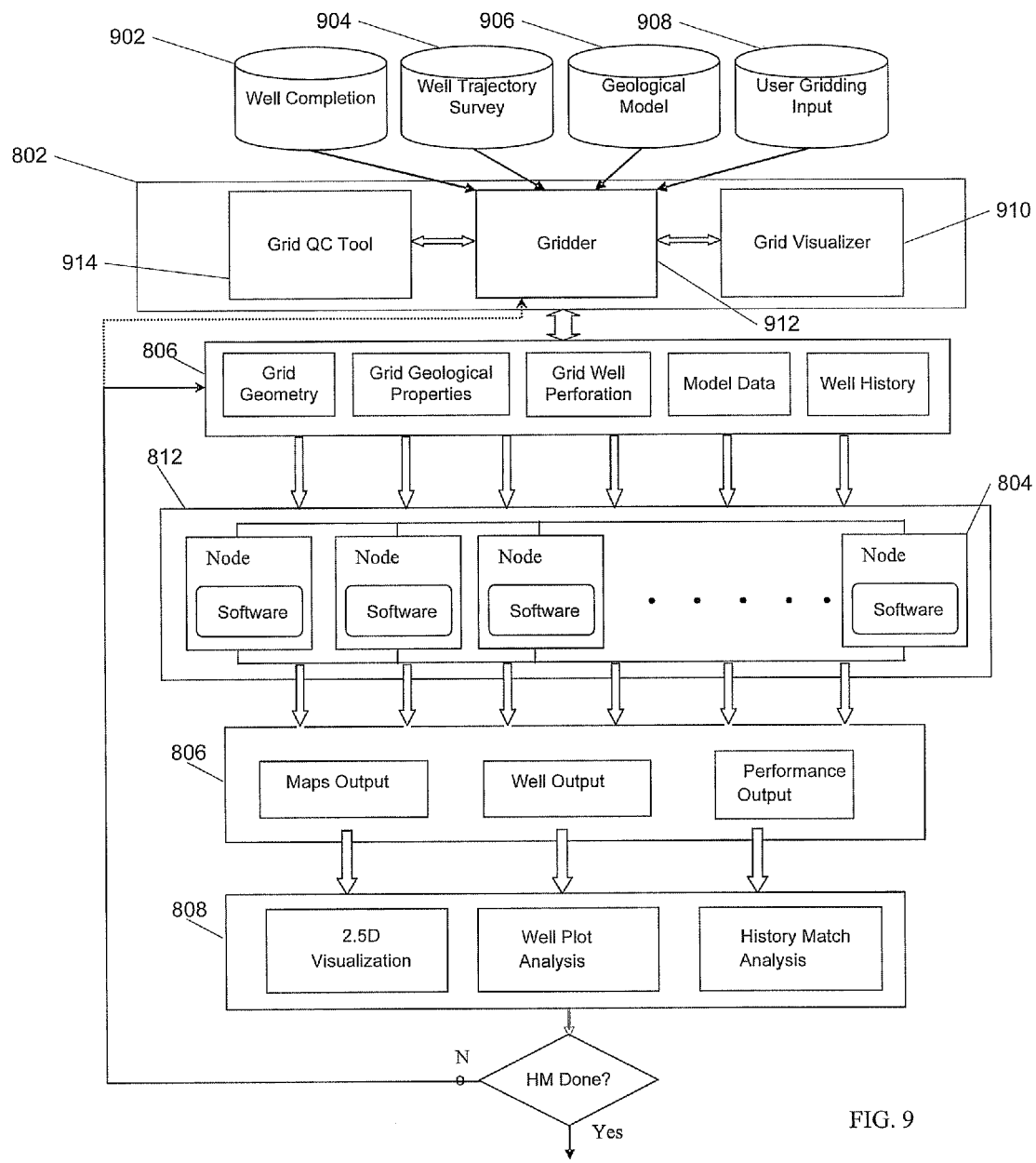
FIG. 9 is a flow diagram of the distributed network of FIG. 8 showing the software loaded on and the data flow from various components of the distributed network according to an embodiment of the invention.

FIGS. 8 and 9 describe a networked group of computers defining an embodiment of the machine of the instant invention. The exemplary machine consists of a pre-processing server 802 for generating and managing the reservoir grids and directing grid data into storage; a plurality of application servers 804 for receiving grid, well-production and completion data and processing reservoir simulations; file server 806 for the management and storage of simulation data, reservoir grids, geological data, well-production data, and well completion data in files or databases in the memory; post-processing server 808 for processing completed simulation data, workstations 810 for viewing simulations and well performance data generated by application servers 804 and computer network 816 for connecting the pre-processing server 802, application servers 804, file server 806 and post-processing server 808 to workstations 810.

As shown, at least one file server 806 is employed by the machine to manage well production and completion data, grid data, and simulation data and to allow the pre-processing server 802, post processing server 808 and plurality of application servers 804 to upload data to and download data from the file server 806. The file server 806 may include databases such as well completion database 902, well trajectory survey database 904, geological model database 906, and user gridding input database 908, each providing data to pre-processing server 802; databases or files storing grid geometry, grid geological properties, grid well perforation, model data, well history generated by pre-processing server 802 and input into the application servers 804; databases or files storing output maps, well output, and performance calculations generated by application server 804 and input into the post-processing server 808; and databases or files storing 2.5D visualization data, well plot analyses, and history match analyses output from post-processing server 808. File server 806 may be network attached storage (NAS), storage area networks (SAN), or direct access storage (DAS), or any combination thereof, comprising, e.g., multiple hard disk drives. File server 806 may also allow various user workstations 810 to access and display data stored thereon. Accordingly, as is known in the art, file server 808 may have stored thereon database management system, e.g. a set of software programs that controls the organization, storage, management, and retrieval of data in the databases, such as 902/904/906/908.

Databases 902/904/906/908, and any other databases or files stored in file server 806, may be separate databases as shown, or the same database, and well completion data, e.g., well production, completion and injection data; geological data e.g., fluid dynamics, rock porosity, etc; and simulation data, e.g., completed or partially complete grids or simulations, can be stored in a plurality of databases, tables, or fields in separate portions of the file server memory. As one skilled in the art will appreciate, file server 806 provides the pre-processing server 802, each of the application servers 804, and the workstations 810 access to the databases through, e.g., database management software or other application. Moreover, a database server may be used to store the databases instead of or in addition to file server 806, and such a configuration is within the scope of this disclosure. In some configurations, file server 806 may be configured so that the organization of data files that store simulation data and the output snap-shots of dynamic simulation results are independent of the number application servers 804 used to run a simulation model. As such, the inventive method may generate an indexing system to do parallel scattered I/O where each application server 804 reads data and write results for its portion of the simulation to the exact positions, i.e., data files, in the file server. In such an embodiment, regardless of the number of application servers used, the data and results stored in data files are always the same. In some applications, the well and reservoir data may be stored in databases, but all or a portion of grid data output from gridder 912 can be stored in an indexed files and are organized using global cell indexing, which is a variant of the number of application servers 804 used to process the model, e.g. compressed sparse row (CSR) format.

Figure 1:
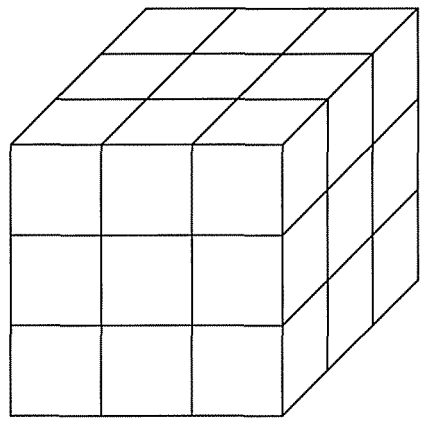
FIG. 1 is a perspective view of a model for a three-dimensional, Cartesian structured grid according to the prior art.
Figure 2:
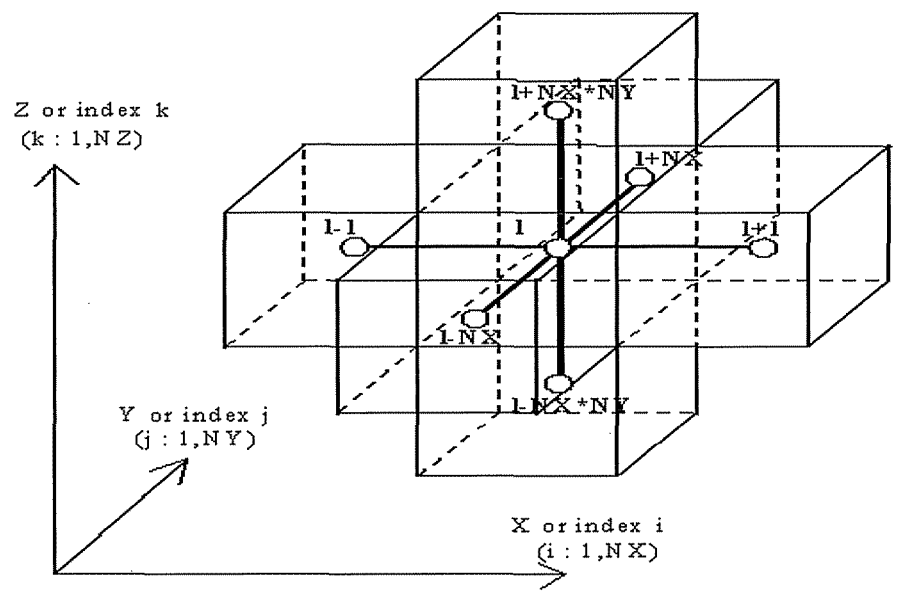
FIG. 2 is a perspective view of a model for a three-dimensional, Cartesian structured grid having indices (X, Y, Z) according to the prior art.
Figure 3:
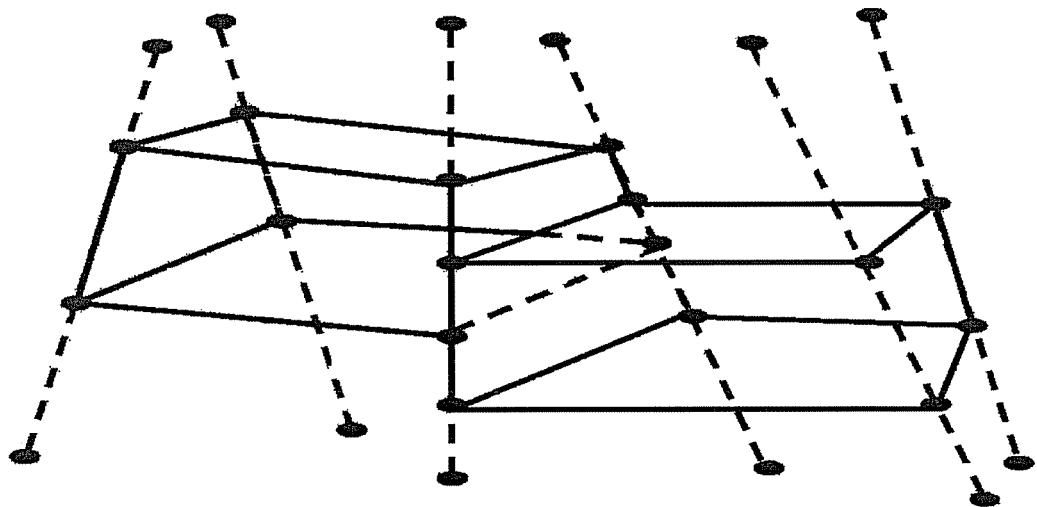
FIG. 3 is a perspective view of a model for a three-dimensional, corner point geometry ("CPG"), structured grid showing six pillars defining the hexahedrons of the grid according to the prior art.
Figure 4:
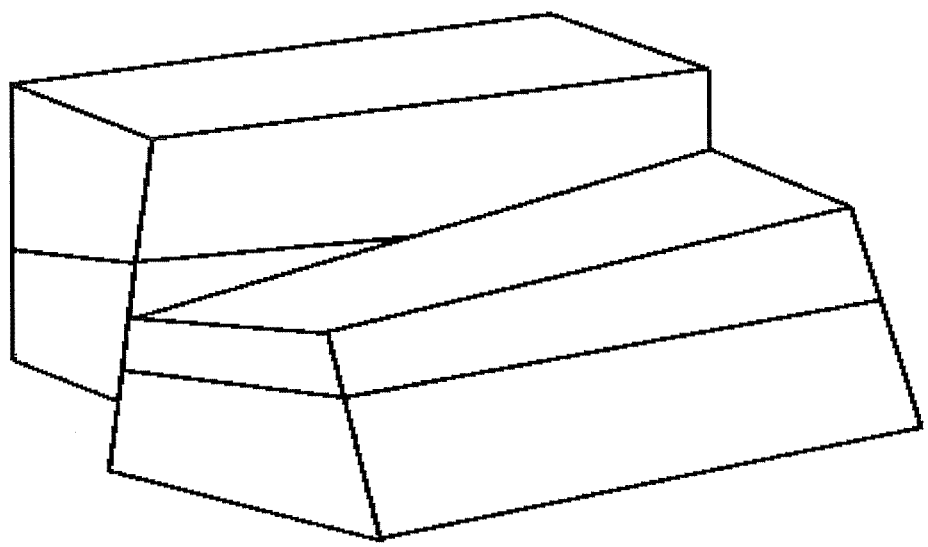
FIG. 4 a perspective view of a model for a three-dimensional, CPG, structured grid showing four interconnected hexahedrons according to the prior art
Figure 17:
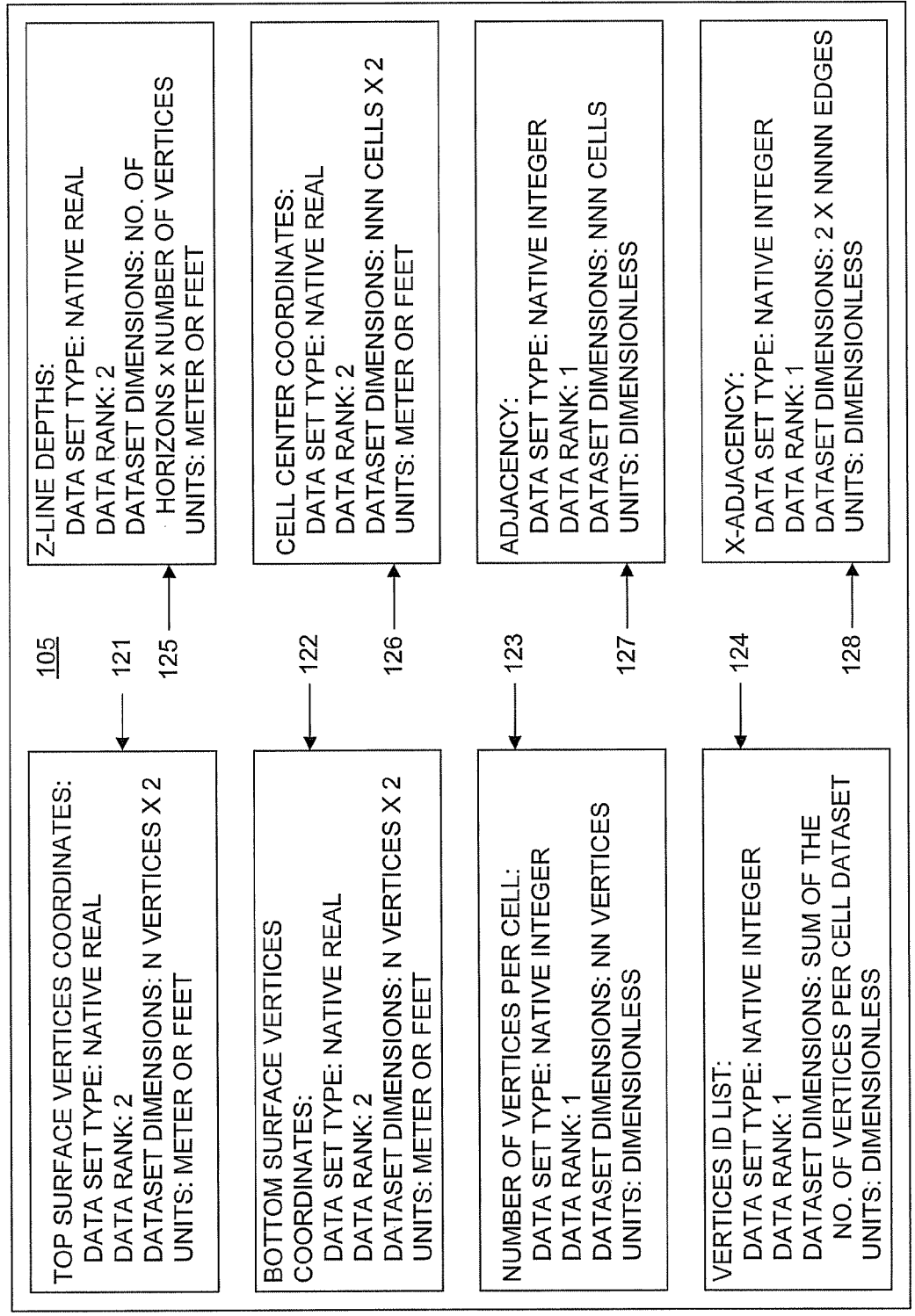
FIG. 17 is an exemplary table of dataset parameters for a data ser created using a machine, program product and methods of an embodiment of the present invention.

As is known in the art, CSR format stores data as groups and datasets that are arrays defined by the data's attributes, and provides faster access to data points and can support larger and more complex datasets than traditional database formats, e.g., SQL. Therefore, in such embodiments, some databases and file represented in FIG. 3B could use CSR format for the datasets to indicate the spatial connectivities of grid cells in the model. In this regard, as illustrated in FIG. 17, exemplary dataset array parameters may be defined using CSR protocols. While the creation of the datasets by gridder 912 will be discussed in detail below, datasets stored in file server 806 can be defined by a dataset type, data rank, dataset dimensions and units. Together, the file server 806 can store enough datasets to define, completely and uniquely, the reservoir geometry utilizing a 2.5D unstructured grid of the instant invention.

Returning to FIG. 8, workstations 810 are connected to the machine 800 using, e.g., communication network 816. Workstations 810 may be any personal computer (PC) as is known in the art and may run UNIX, Linux, Windows®, or some other operating system compatible with the networked systems discussed herein. Moreover, workstations 810 may access computer program products stored on pre and post processing servers to input simulation or processing parameters. For example, simulation engineers positioned at workstations 810 could manually select fluid parameters, production characteristics, i.e., run a simulation with various well types such as multi-lateral wells with different numbers and sizes of laterals, reservoir or simulation size, rock features, etc., through software applications stored or accessible on the workstations. Data entered from the workstations can be stored on the file server 806 memory, pre-processing server 802 memory, or post-processing server 808 memory for access during the reservoir simulation. Simulation engineers may also access simulation data, partial or complete, simulation characteristics, run time, processor speed, compute processes run, etc., on application servers 804 as may be needed to monitor the simulation. As one skilled in the art will appreciate, it is possible for workstations 810 to interface with a separate web or network server for access to the simulation through the communications network, and such a configuration may be preferred.

Communications network 816 connects the workstations 810, the machine 800, and various networked components together. As one skilled in the art will appreciate, the computer network 816 can connect all of the system components using a local area network ("LAN") or wide area network ("WAN"), or a combination thereof. For example, pre-processing server 802, file server 806, application servers 804, and post-processing server 808 may be privately networked to allow for faster communication and better data synchronization between computing nodes, or pre-processing server 802, application servers 804, file server 806, and post-processing server 808, may be networked using a LAN, with a web server (not shown) interfacing with the workstations 810 using a WAN. Accordingly, though not all such configurations are depicted, all are within the scope of the disclosure.

At least one pre-processing server 802 and application servers 804, for example, perform the functions of the inventive method of the invention, and are used to perform reservoir simulations. In addition, pre-processing server 802, although represented as one server, may be a plurality of servers, e.g., may be configured as separate application servers and a web server, creates the unstructured 2.5 dimensional reservoir grid and assigns the distributed computers a portion of the grid for processing, as will be discussed herein below. Application servers 804 perform the simulation processing functions for each of the grid cells loaded into the server for processing. As one skilled in the art will appreciate, though depicted as application servers, each of the application servers 804 may be workstations that can be used by individual simulation engineer to access data. One skilled in the art will appreciate, however, that parallel processing techniques described herein are by way of example, and the methods and gridding software of the instant invention can be used in serial processing environments. Importantly, each application server performs a distributed read of the grid data it owns for processing. As one skilled in the art will appreciate, each application server accessing the file server 802 is only required to read data regarding one process node.

As shown in FIG. 8, the file server 806 is connected to a network of applications servers 804. The applications servers 804 are depicted separately networked on TCP/IP network that allows for rapid communication between the compute nodes—though depending upon the cluster architecture, both the application servers 804 and pre-processing server 802 may be separately networked. For example, the application servers 804 may be configured as a PC cluster, with each application server having separate software loaded thereon on reading compute data from the file server 806 to perforin data processing. Alternatively, as one skilled in the art will recognize, the application servers 804 may be configured as a compute cluster, or Beowulf cluster, where the pre-processing server 802 or similar server distributes files to the application server 804 using communication libraries that allow for data exchange. As one skilled in the art will also recognize there are several different methodologies for deploying distributed computing systems and all of these are within the scope of this disclosure. Moreover, the system architecture may support a variety of operating systems and communications software for each of the pre-processing server 802 and application servers 804. For example, Unix, Linux, Microsoft Compute Cluster, etc., are examples of operating systems that may be used to form a super computer like the one contemplated herein, and Message Passing Interface (MPI interfacing) or Parallel Virtual Machine (PVM) software libraries may be used to provide communication between the file server 806 and application servers 804 which is discussed in detail herein below.

Figure 10:
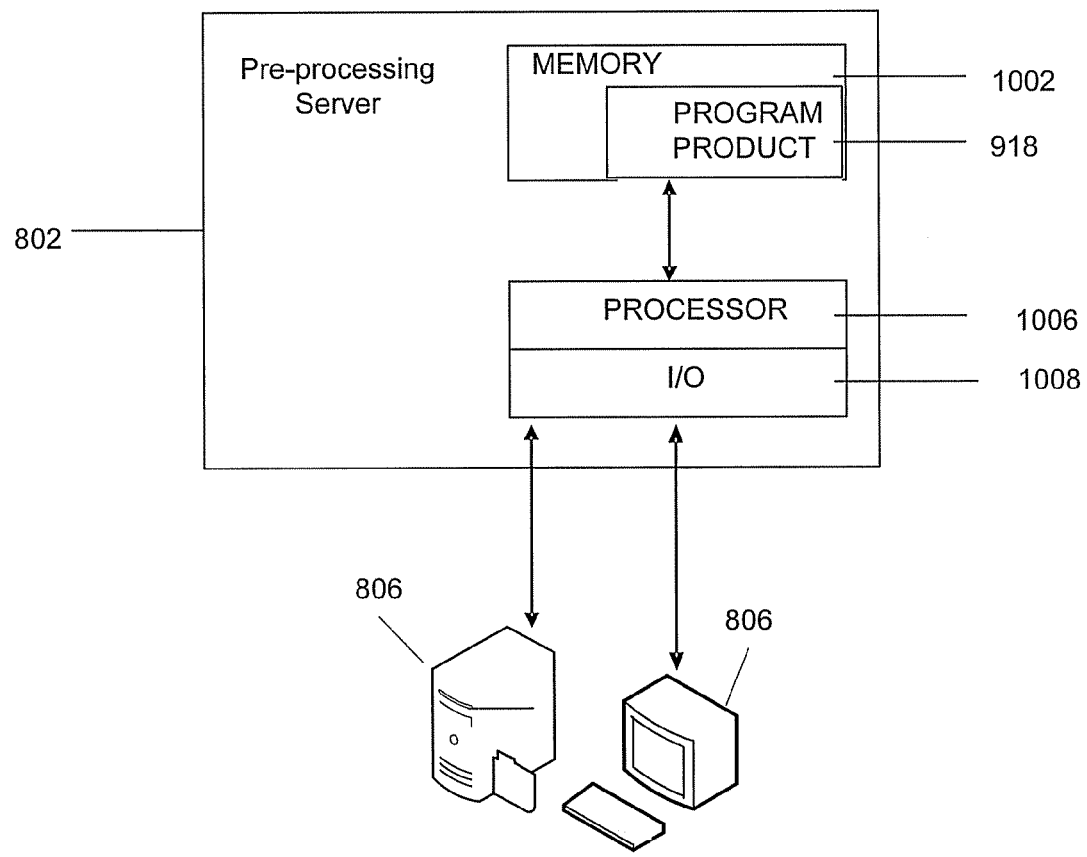
FIG. 10 is a diagram a pre-processing server showing various components operable thereon and used in the distributed network according to an embodiment of the invention.

The pre-processing server 802 will now be described with reference to FIG. 10. The pre-processing server 802 comprises a memory 1002, a program product 918, a processor 1006 and an input/output device ("I/O device") 1008. I/O device 1008 connects the pre-processing server 802, via the network, to file server 806, and can be any I/O device 1008 including, but not limited to a network card/controller connected by a PCI bus to the motherboard, or hardware built into the motherboard to connect the pre-processing server 802 to the network 816. As can be seen, the I/O device 1008 is connected to the processor 1006. Processor 1006 is the "brains" of the pre-processing server 802, and as such executes program product 918 and works in conjunction with the I/O device 1008 to direct data to memory 1002 and to send data from memory 1002 to the network. In this way, processor 1006 may also make available the program product 918 to the application servers 804 and workstations 810. Processor 1006 can be any commercially available processor, or plurality of processors, adapted for use in an pre-processing server 802, e.g., Intel® Xeon® multicore processors, Intel® micro-architecture Nehalem, AMD Opteron™ multicore processors, etc. As one skilled in the art will appreciate, processor 1006 may also include components that allow the pre-processing server 802 to be connected to a display [not shown] and keyboard that would allow a user direct access to the processor 1006 and memory 1002.

Memory 1002 may store several pre-processing software applications and the well history and grid data related to the methods described herein. As such, memory 1002 may consists of both non-volatile memory, e.g., hard disks, flash memory, optical disks, and the like, and volatile memory, e.g., SRAM, DRAM, SDRAM, etc., as required by embodiments of the instant invention. As one skilled in the art will appreciate, though memory 1002 is depicted on, e.g., the motherboard, of the pre-processing server 802, memory 1002 may also be a separate component or device, e.g., FLASH memory, connected to the pre-processing server 802. Memory 1002 may also store applications that the workstations 810 can access and run on the pre-processing server 802.

As shown in FIG. 9, and similarly to the GIGAPOWERS™ system, the file server is accessed e.g., data from well completion database 902, well trajectory survey database 904, geological model database 906, and user gridding input database 908, by the pre-processing server 802 to perform preliminary calculations and grid generation using the inventive software of the invention. Gridder 912 pre-processes data from the database to grid the reservoir using the inventive computer program product 918 described herein. Grid partitioning for reservoir simulation is done in software application 804, which include METIS/PARAMETIS method provided by George Karypis at the University of Minnesota. The application servers 804 use the partition information to do a scatter read of data and to perform parallel reservoir simulation. The simulation results can then be interpreted by post-processing server 808. Specifically, post-processing server 808 accesses simulator results, including map output, well output and performance output, which may be stored on the file server 806, and generates user-friendly data displays. For example, post-processing server may have software loaded thereon that provides 2.5D visualization of the reservoir, well plots within the reservoir, and generates an analysis of the simulation results as compared with historical simulations. As one skilled in the art will appreciate, though depicted as separate servers for simplicity, pre-preprocessing server and post-processing server may be configured as the same server or cluster of servers. Finally, workstations 810 can access the post-processing server 808, or file server 806 to, e.g., modify, specify, control, upload, download or direct any output software. These software modules run and are stored on, for example, on application server 812.

As one skilled in the art will appreciate, each pre-processing server 802 may communicate with the file server 806, and file server 806 may communicate with application servers 804 using, e.g., a communications software such as MPI interfacing. As known in the art, MPI interfacing comes with a plurality of library functions that include, but are not limited to, send/receive operations, choosing between a Cartesian or graph-like logical data processing 804 or a unstructured topology, combining partial results of computations, synchronizing application servers for data exchange between sub-domains, as well as obtaining network-related information such as the number of processes in the computing session, current processor identity that a application server 804 is mapped to, neighboring processes accessible in a logical topology, etc. Importantly, as is known in the art, the MPI interfacing software can operate with a plurality of software languages, including C, C++, FORTRAN, etc., allowing program product 1006 to be programmed or interfaced with a plurality of computer software program products programmed in different computer languages for greater scalability and functionality, e.g., an implementation where pre-processing server 802 is implemented as a plurality of servers running separate programs for pre-processing algorithms.

Figure 11:
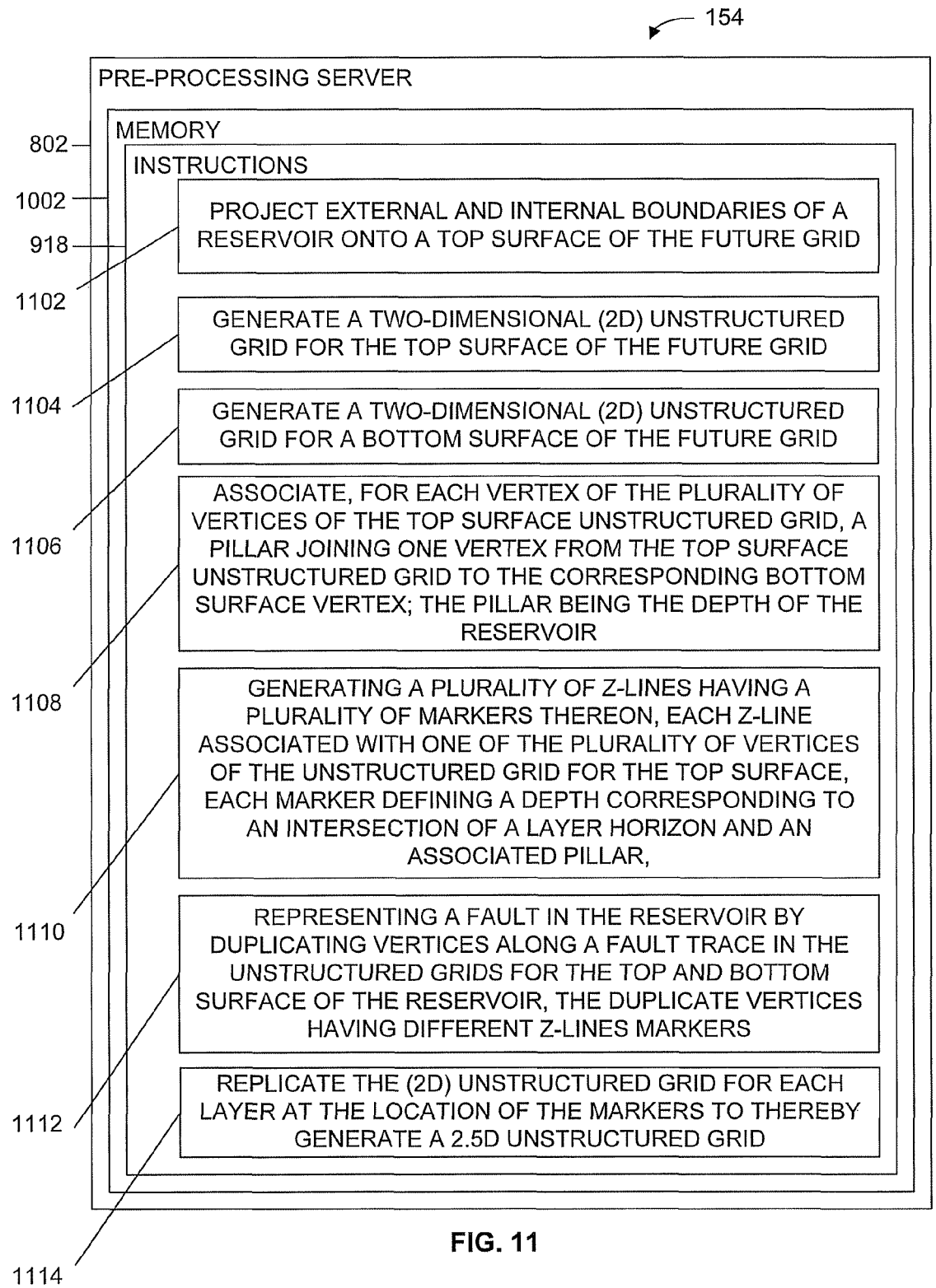
FIG. 11 is a diagram of a pre-processing server having a memory and a program product of an embodiment of the instant invention installed thereon

Program product 918 performs the methods of the invention and is stored and operable on the pre-processing server 802. The program product 918 of the instant invention is stored in memory 1002 and operable on processor 1006, as shown in FIG. 11. The program product 918 performs the steps of projecting external and internal boundaries of a reservoir onto a top surface of a future grid (1102), constructing a 2D unstructured grid along the top horizon and using fault lines and pinch-out locations (1104), reconstructing the unstructured grid along a bottom horizon taking into account the fault lines and pinch-out locations (1106), i.e., placing the unstructured grid slightly skewed from the position of the unstructured grid on a top horizon, constructing a vertical line to connect vertexes on the top and bottom unstructured grids, the vertical line corresponding to the depth of the reservoir, and assigning an index on the vertical line corresponding to a horizon of each layer in the reservoir (1108), constructing other vertical lines with different indexes when a fault or pinch-out occurs in the reservoir thereby assigning each unique layer a unique index (1110); copying the two-dimensional, unstructured grid created for the top layer to each marker location; assigning each grid cell vertex and each grid cell an index and storing each grid cell and grid vertex index in memory using CSR (compressed sparse row) format. The program product may also partition the grid for processing by the application servers 804. Once the grid cells are stored in file server 806, the grid cells and grid vertices can be retrieved by application servers 804 the grid cells and grid vertex indexes from memory for parallel processing, and reading well and reservoir property data into application servers to perform parallel global fluid flow simulation. In other words, in the exemplary embodiment, the pre-processing server 802 generates the grid data for the application servers 804 to provide parallel processing of the reservoir simulation.

Figure 18:
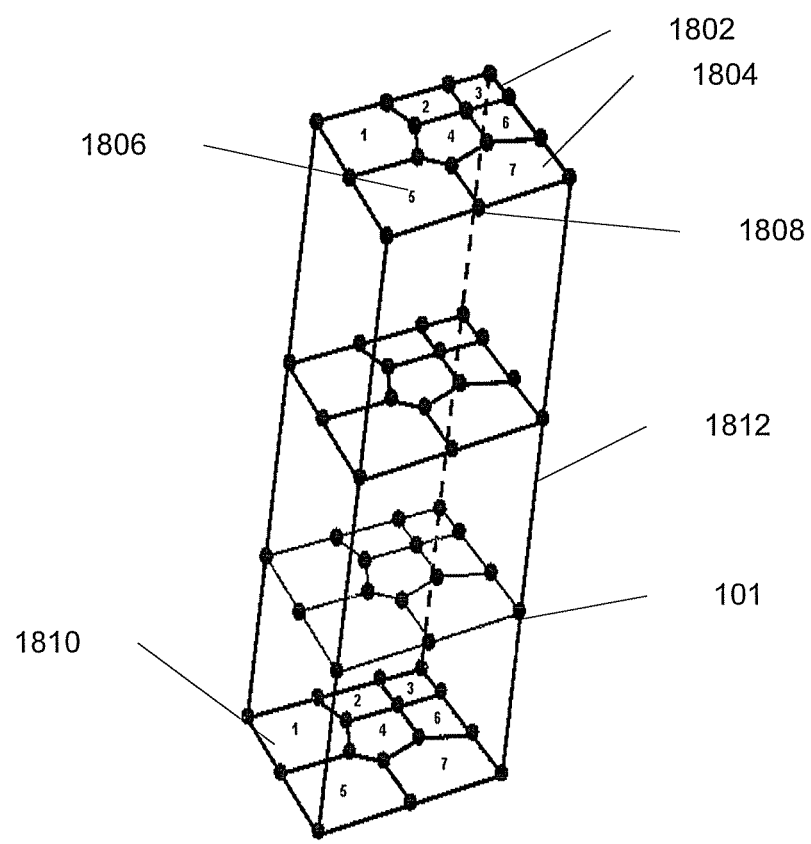
FIG. 18 is a model of a 2.5D grid generated using a machine, program product and methods of an embodiment of the present invention.

The instructions of the program product of the instant invention will now be discussed in detail with reference to FIG. 18. The computer program product first determines the locations of, e.g., layers, fault lines and pinch outs in the reservoir using the data from geological database 906. Then, an unstructured grid 1802 is constructed for the top layer of a future grid of the reservoir to honor the geological features of the reservoir, well geometries, etc using data from the well completion database, the well trajectory survey database, and any user input. The unstructured 2D grid is obtained by projecting the external and internal boundaries of geological and well features, e.g., reservoir extensions, aquifers, production areas, well geometry, faults, pinchouts, etc., onto the top layer of the future grid. Then, cell centers are computed by determining a desired grid density, e.g., by user selection data from the user gridding input database 908, and projected external and internal boundaries of the future grid.

To generate the grid cells 1804, a Delaunay triangulation is generated for a plurality of cell centers 1806, i.e., the cell centers are the vertices for the triangulation. As is known in the art, Delaunay triangulations are triangulations in which no vertex of any triangle lies inside the circumcircle of another triangle. Advantageously, various computer algorithms are known to automate Delaunay triangulation in two-dimensions for a set of points. To compute the Voronoi grid from the triangulation, the center 1806 of each circumcircle around each triangle in the triangulation is joined to create grid cells defined as a plurality of convex polygons, i.e., the Voronoi grid is a dual graph of the Delauny triangulation of the cell centers chosen, and the grid cell can be completely described by the cell center chosen, the vertices of the cell, which correspond to the circumcircle centers, and the number of vertices per cell, which is the number of lines required to form a polygon from circumcircle centers. Thereby, the methods for generating Delaunay triangulations allow for efficient 2D, Voronoi grid generation, and the efficient storage of data to generate the grid in memory according to the techniques of the invention. As one skilled in the art will appreciate, the basic properties of Voronoi diagrams (which are locally orthogonal unstructured grids) and Delaunay triangulations are well known and are further described in "Voronoi Diagrams—A survey of a Fundamental Geometric Structure" by Franz Aurenhammer, in ACM Computing Surveys, Vol. 23, No. 3, pages 345-405, September 1991.

Once the unstructured grid is generated for a top layer, a gridded surface is defined for a bottom layer 1810 of the future grid that is located in, e.g., an almost identical position to the grid generated for the top layer. So that the techniques of the invention achieve the desired computational efficiency, the grid cells in the top and bottom layers are substantially identical. Where non-vertical faults are being modeled using the grid, a small translation in the lateral position of the top and bottom grid cells is calculated, though as one skilled in the art will appreciate, when there are vertical faults or no faults in the reservoir being modeled, it is not necessary to translate the lateral positions of the grid cells in the top and bottom layers.

Figure 12:
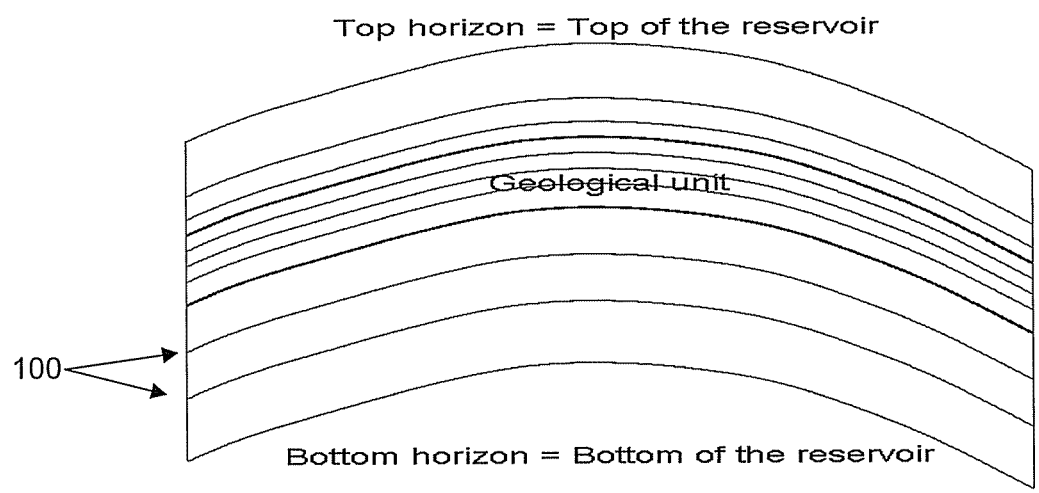
FIG. 12 is a graph showing a reservoir with a plurality of horizons that is used to generate a 2.5D grid using a machine, program product or method of an embodiment of the present invention.

After the grids for the top and bottom layers are defined, pillars 1812 are constructed that join the vertices of the Voronoi grid in the top layer to the vertices of the Voronoi grid in the bottom layer. The pillars correspond to the depth of the reservoir. Then, the reservoir layers are determined. As illustrated in FIG. 12, a reservoir is made of geological units as understood by those skilled in the art, divided in layers. For modeling purposes, the different layers can be limited vertically by horizons. For example, the first horizon can be the top of the reservoir; the last horizon can be the bottom of the reservoir, with the remaining horizons dividing the reservoir into layers. As can be seen, for a given layer in the reservoir, the vertical (or near-vertical) line defining, e.g., a pillar named z-line 102 can include a series of markers 101, where each marker 101 corresponds to an intersection of a horizon 100 defining the layer with the z-line. Returning to FIG. 18, markers 101 determine the position to replicate the unstructured grid 1802 for simulation, and such an unstructured grid is replicated at every marker.

Figure 19:
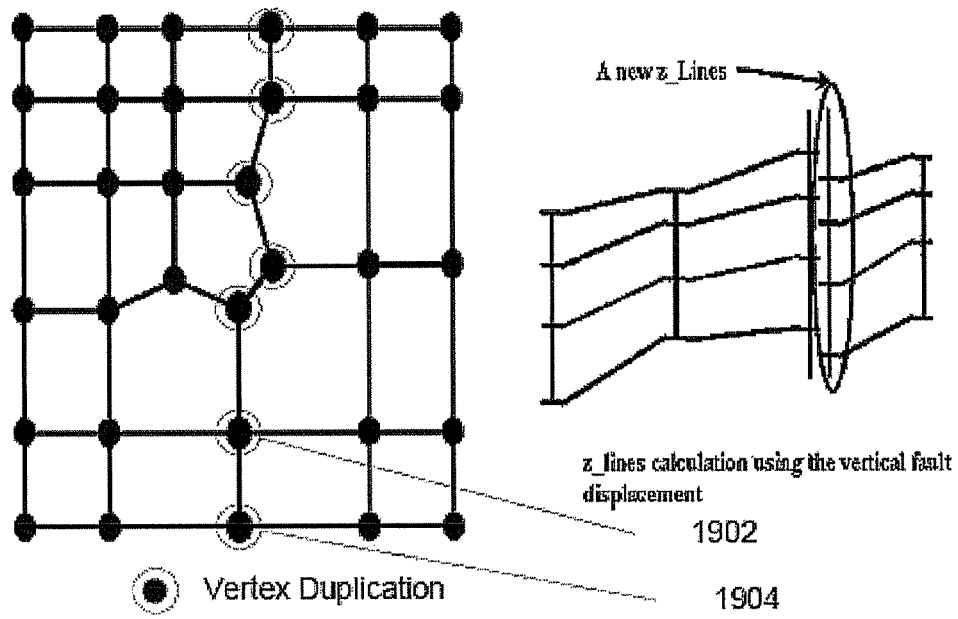
FIG. 19 is an exemplary diagram of vertex duplication used by a machine, program product and method of an embodiment of the present invention to model a vertical fault.
Figure 20:
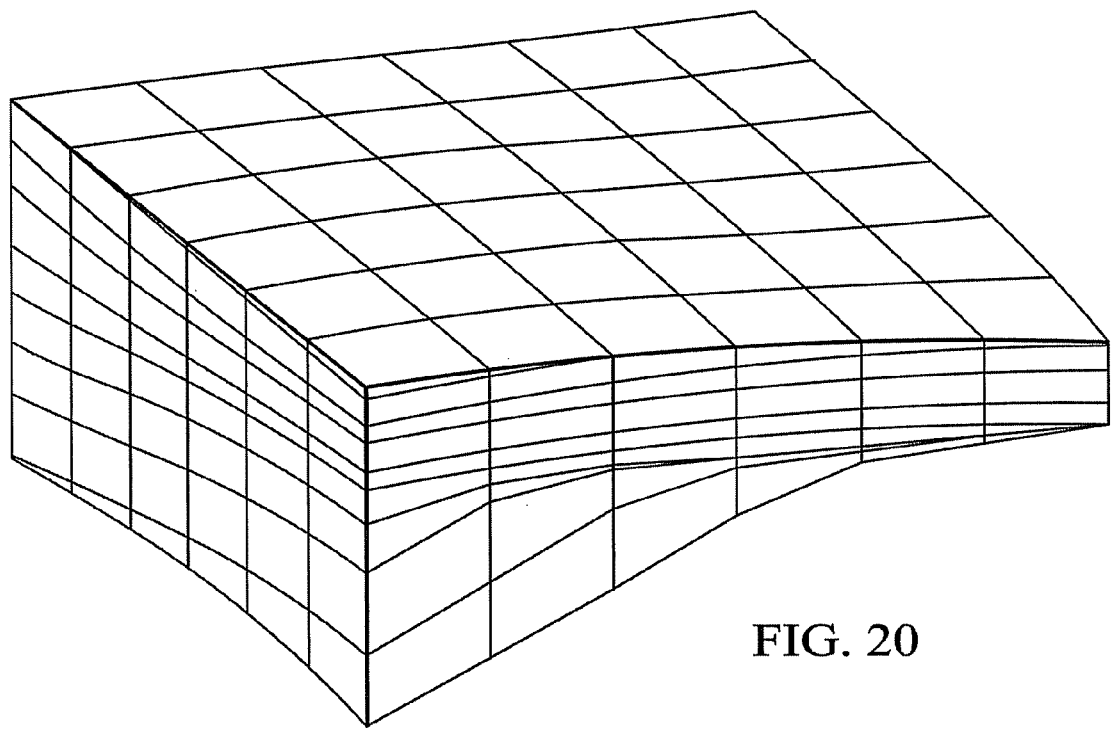
FIG. 20 is an exemplary model used by a machine, program product and method of an embodiment of the present invention to model a pinch-out.
Figure 21:
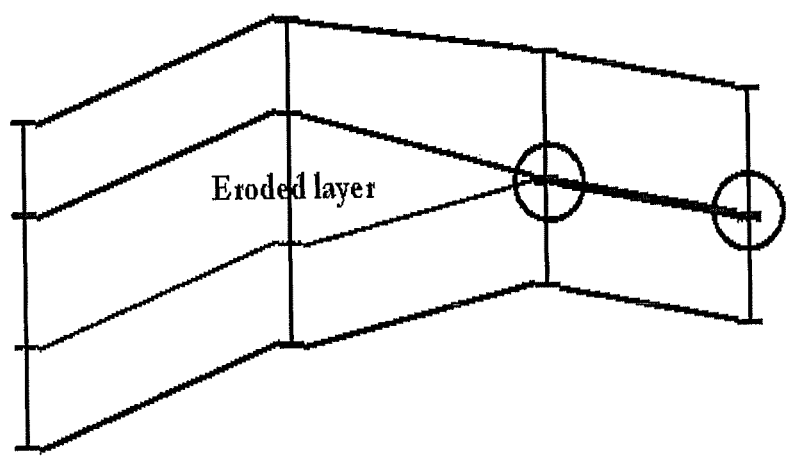
FIG. 21 is an exemplary diagram of vertex duplication used by a machine, program product and method of an embodiment of the present invention to model a pinch-out.

When a fault is observed in the reservoir, it can be accounted for in the 2.5 graph by duplicating vertices along a fault trace 1902 with unstructured two-dimensional grids that correspond in structure to the unstructured grid generated for the top layer, as shown in FIG. 19. The duplicate vertices can then have, for example, different z-lines connecting the top and bottom layers. Thereby, the duplicated vertices can be in substantially the same location as the original vertices and vary based upon the position of the fault line. From a visualization point of view, one group of vertices (e.g., the original vertices) is to be on one side of the fault and the other group (e.g., the duplicated vertices) is to be on the other side of the fault—with the portion of the unstructured grid on either side being replicated along the markers. Moreover, when a pinch-out or erosion of a layer is observed in the reservoir, a subset of a plurality of z-lines wherein each z-line in the subset has one or more identical adjacent markers representing horizon depths, model a pinch-out, e.g., an eroded layer, or a coarsening, as shown in FIGS. 20 and 21. Accordingly, by determining different markers 101 for layers surrounding, e.g., a fault or a pinch-out, the horizons do not need to be uniformly spaced, but instead may follow from the properties of the geological units.

Figure 22:
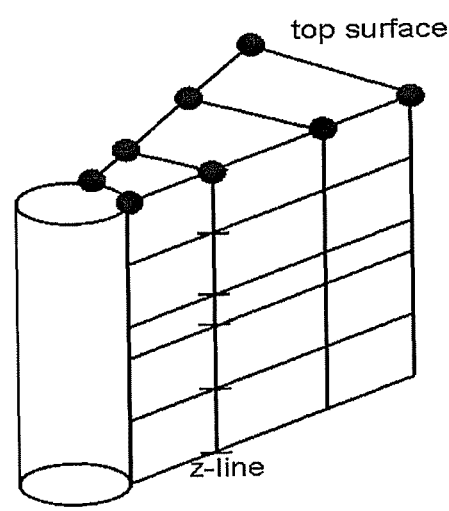
FIG. 22 is an exemplary model generated by a machine, program product and method of an embodiment of the present invention to model a radial grid.

The machine, program products and methods of the invention are not limited to generating 2.5D unstructured grids. The machine program products and methods of the invention may generate, for example, 2.5D structured grids that use Cartesian, CPG or radial structured horizon layers as shown in FIGS. 20 and 22. Data system of such embodiments can provide horizon grid surfaces that are identical with each cell a rectangle, and vertical or nearly vertical z-lines that are uniformly spaced. In other words, a graph is regular, with each internal cell having four neighbors. In other embodiments, a Cartesian grid may be generated for the horizons with Local Grid Refinement (LGR) to model complex geological features. In such embodiments, the horizon surfaces are identical with each cell a rectangle; the z-lines are vertical. In contrast to a regular Cartesian grid, the graph stencil with LGR is irregular; the number of cell neighbors is variable and characterized by the adjacency data of the graph. In other data system embodiments, the grid may be generated using corner point geometry (CPG). In such embodiments, the z-lines can be slanted. Still in other embodiments, a radial grid may be approximated. In such embodiments, the horizon surfaces can be delineated with cell vertex points located at concentric disks.

Advantageously, the structured grid embodiments of the present invention provide a unified methodology, e.g., utilizing 2.5D unstructured grids, for simulation and visualization of reservoirs, allowing for the converting of other grid structures. It will be understood by those skilled in the art that a conversion, e.g. a straightforward or mechanical conversion, of a three-dimensional (3D) Cartesian grid into a format for 2.5D unstructured grids, e.g., data structure embodiments as described herein, may not reduce the number of data points or the memory requirements associated therewith, i.e., if every data point from the original grid is represented in the converted format. If the layered nature of the reservoir is taken into account, however, fewer data points are necessary to accurately model, simulate, and visualize the reservoir utilizing a 2.5D unstructured grid embodiment, allowing for a reduction in the number of data points ultimately processes. It will be further understood by those skilled in the art that 2.5 dimensional unstructured grids have advantages and benefits independent of storage memory requirements, including standardization for algorithm development and processing, memory allocation and retrieval, and others.

Figure 15:
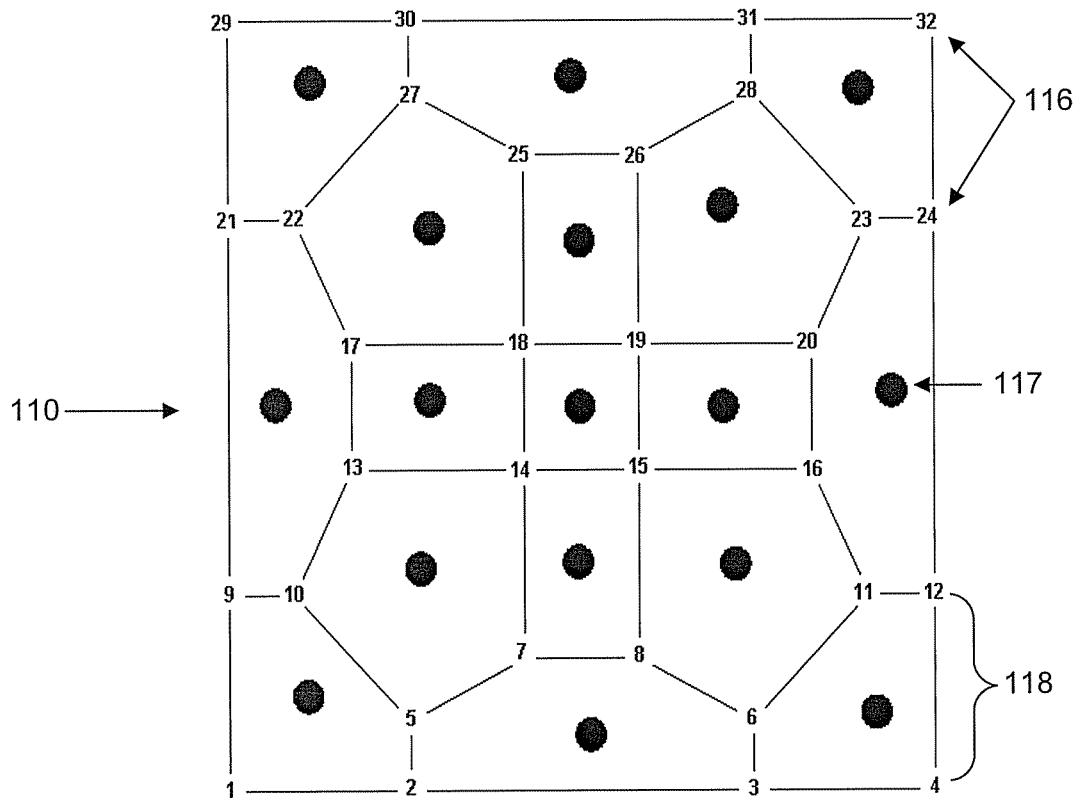
FIG. 15 is a diagram of an unstructured, two-dimensional grid having adjacency arrays for each vertex generated in compressed sparse row (CSR) format using an embodiment of the present invention.
Figure 16:
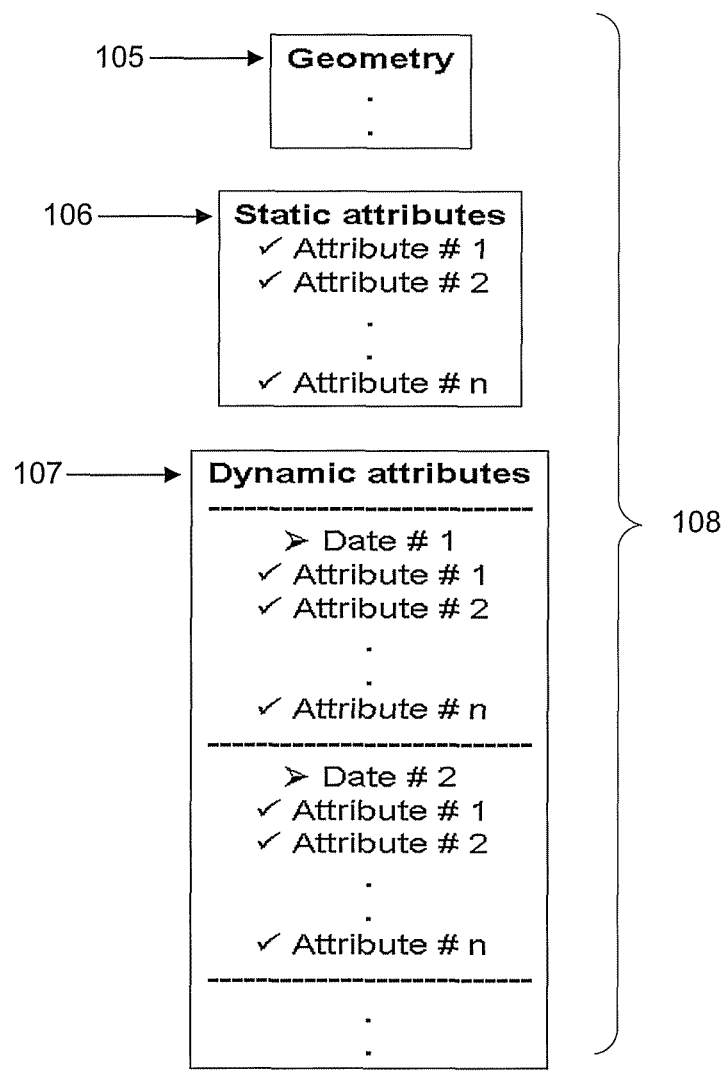
FIG. 16 is an exemplary data system generated using a machine, program product and method of an embodiment of the present invention.

The method of storing data describing the 2.5D unstructured grid generated above in the file server 806 along with, optionally, the attributes of the well and reservoir, will now be described with reference to FIGS. 14-17. A data system 108 is output from the pre-processing server 802 and represents a reservoir having a plurality of geological layers delineated by horizons, as described above. As shown in FIG. 16, the data system 108 can include, for example, a first data file 105, that contains data needed to model a geometry of a reservoir as 2.5D unstructured grid. The data system 108 can also include, for example, an optional second data file 106 to contain data related to one or more static properties of the reservoir. Static properties can include, for example, a porosity value, a permeability value, and a rock type. Values for the static properties can be defined for each cell center. The data system can also include, for example, an optional third data file 107 to contain data related to one or more dynamic properties of the reservoir at a plurality of dates. Dynamic properties of the reservoir can include, for example, a pressure value, a temperature value, and a saturation value. Values for the dynamic properties can be also defined for each cell center at each date. The static and dynamic properties, e.g., attributes, of the cells can be straightforward given the reservoir geometry, i.e., the first data file 105 that contains data related to the model of a reservoir as 2.5D unstructured grid. The combination of the first, second, and third data files, 105, 106, and 107 respectively, allows for a complete description of the reservoir.

According to an exemplary embodiment of the present invention, a first data file 105 for containing data related to model a geometry of a reservoir as 2.5D unstructured grid, is written into memory using CSR format, as illustrated in FIG. 17. In such embodiments, to create the data structure for storage, a group of datasets for data file 105 is defined using a dataset type, dataset rank, dataset dimensions and dataset units. Such datasets can include: a first dataset 121 having coordinates of a plurality of vertices associated with grid cells of a two-dimensional (2D) unstructured grid for a top surface of the reservoir, in a second dataset 122, coordinates of a plurality of vertices associated with grid cells of a two-dimensional (2D) unstructured grid for a bottom surface of the reservoir, e.g., each vertex associated with an unstructured grid for the bottom surface can correspond to one vertex associated with an unstructured grid for the top surface, and the bottom surface grid can have similar grid cell centers as the top surface grid (to be discussed in detail below); in a third dataset 123, a number of vertices per cell for each grid cell; in a fourth dataset 124, a list of vertices defining each grid cell; and in a fifth dataset 125 a plurality of z-lines 102 comprising a plurality of markers 101, stored therein. Moreover, data file 105 can include, in a sixth dataset 126, coordinates of a plurality of cell centers associated with grid cells of a two-dimensional (2D) unstructured grid for the top surface of the reservoir; in a seventh dataset 127, an adjacency list of other vertices for each vertex from the unstructured grid for the top surface defining an adjacency dataset; in an eighth dataset 128, a dataset comprising a plurality of pointers to the adjacency list defining an x-adjacency dataset so that the adjacency and x-adjacency datasets describe a grid dual graph for the unstructured grid for the top surface of the reservoir using a compressed sparse row (CSR) data representation. Although the first, second, third, fourth, and fifth datasets, 121, 122, 123, 124, and 125, respectively, can completely and uniquely define the reservoir geometry, the additional datasets, i.e., the sixth, seventh, and eighth datasets, 126, 127, and 128, respectively, provide advantages and benefits, for example, for grid transmissibility calculations and grid visualization using level of detail (LOD) techniques. In this way, embodiments of the invention store grid data generated using the inventive methods described herein in file server 806.

To generate the data for the datasets stored in data file 105, a two-dimensional (2D) unstructured grid, each grid cell 118 defined by vertices 116 and having a cell center 117, is defined using the techniques above. An exemplary unstructured grid in two dimensions, the grid having seventeen (17) cells and thirty-two (32) vertices, is provided in FIG. 14. A graph 110, i.e., the unstructured grid, can be represented by various data elements defined as the datasets above. The data elements can include, for example, the x and y coordinates of the vertices for top and bottom grid surfaces 113 (dataset 121 and dataset 122); the number of vertices per cell 114 (dataset 123); a list of vertices 115 associated with, i.e., identified with, each grid cell (data set 124); z-line depths (dataset 125); cell center coordinates (dataset 126); adjacency (dataset 127); and x-adjacency (dataset 128). As one skilled in the art will appreciate, while top and bottom grid surfaces are stored in the grid, additional horizon data may also be stored in separate files for the grid (or may be constructed by the simulator using the above-described datasets).

Each dataset will now be described with reference to FIG. 15. As understood by those skilled in the art, an adjacency structure of a graph, e.g., an unstructured grid in two dimensions, may be written to file server 806 in compressed sparse row storage format (CSR) to each dataset 127 and 128, as illustrated in FIG. 15. According to the CSR format of datasets 127 and 128, the adjacency structure of a graph with n vertices and in edges is represented using two arrays: xadj 111 and adjncy 112. The xadj array is of size (n+1) whereas the adjncy array is of size 2 m. For each edge between vertices v and u, this format stores both (v; u) and (u; v). The adjacency list of vertex i is stored in array adjncy starting at index xadj[i] and ending at (but not including) index xadj[i+1] (i.e., adjncy[xadj[i]] through and including adjncy[xadj[i+1]−1]). That is, for each vertex i, its adjacency list is stored in consecutive locations in the array adjncy, and the array xadj is used to point to where it begins and where it ends. For example, vertex 1 has two adjacent vertices, 2 and 9; and vertex 2 has three adjacent vertices, 1, 5, and 3. The array xadj stores 1 (the pointer to the start of the list) and 3 (the pointer to the start of the adjacency list for vertex 2). The array adjncy stores [2, 9, 1, 3, 5 . . . ]. Therefore, the pointer 1 points to the start of the list of vertices adjacent to vertex 1, and pointer 3 points to the start of the list of vertices adjacent to vertex 2. FIG. 15 illustrates the CSR format for an example 32-vertex graph. According to the embodiments of the present invention, the adjacency graph can be the same for all layers of a reservoir; thus, only one two-dimensional (2D) graph can be needed to describe the reservoir with respect to lateral connectivity.

Figure 5:
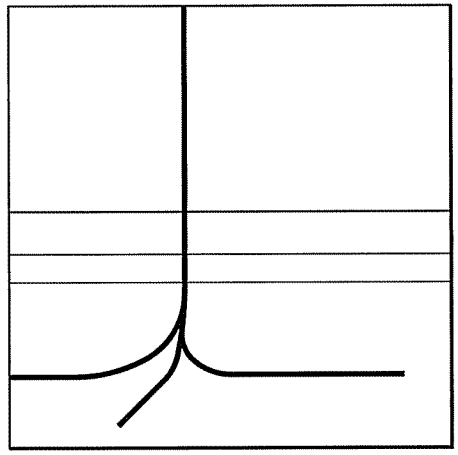
FIG. 5 is a plurality of graphs illustrating non-conventional well configurations according to the prior art.
Figure 5:
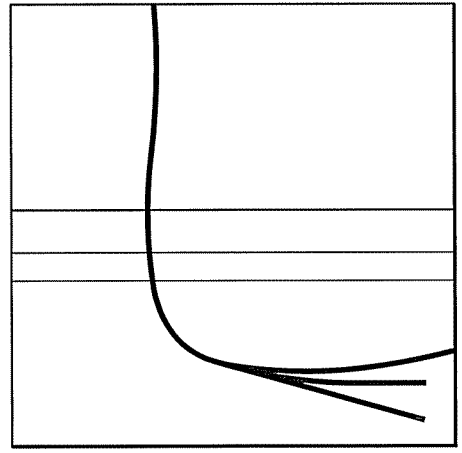
Figure 5:
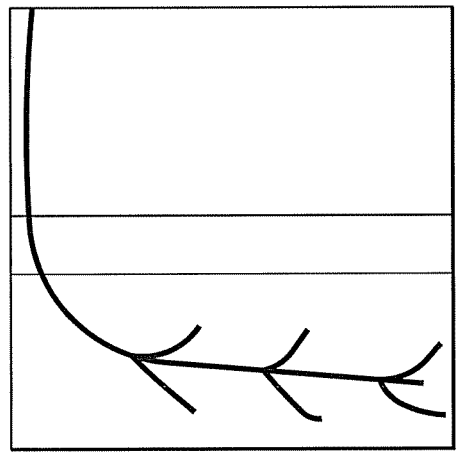
Figure 5:
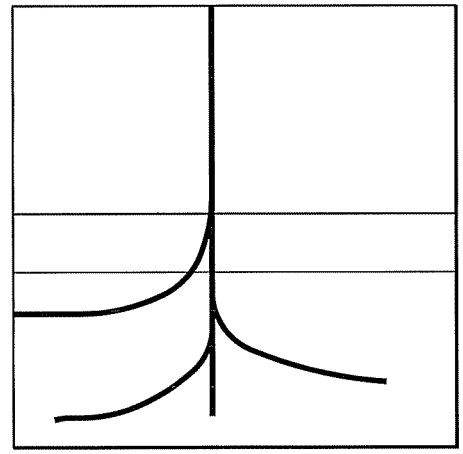
Figure 5:
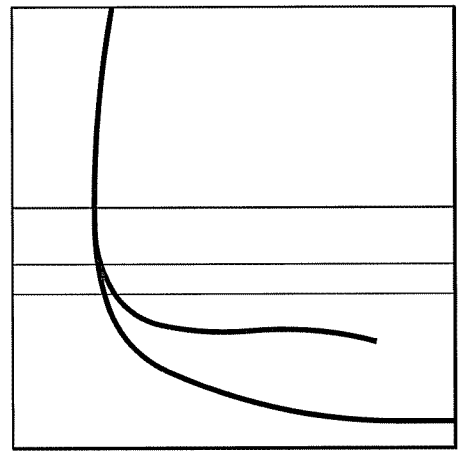
Figure 5:
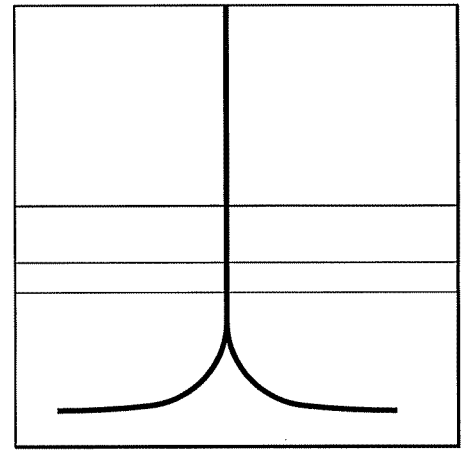
Figure 6:
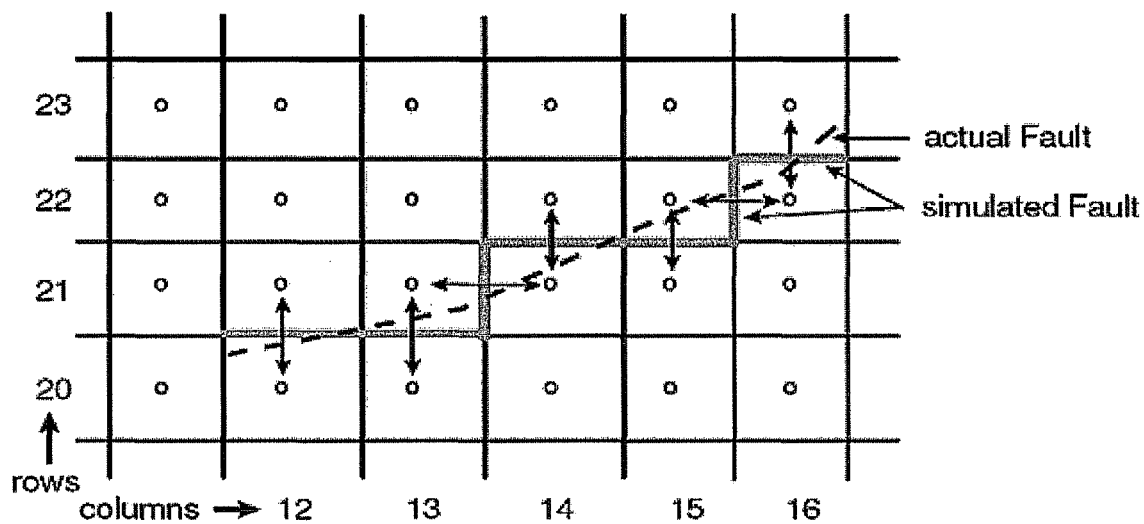
FIG. 6 is a graph depicting fault modeling using a Cartesian grid according to the prior art.
Figure 7:
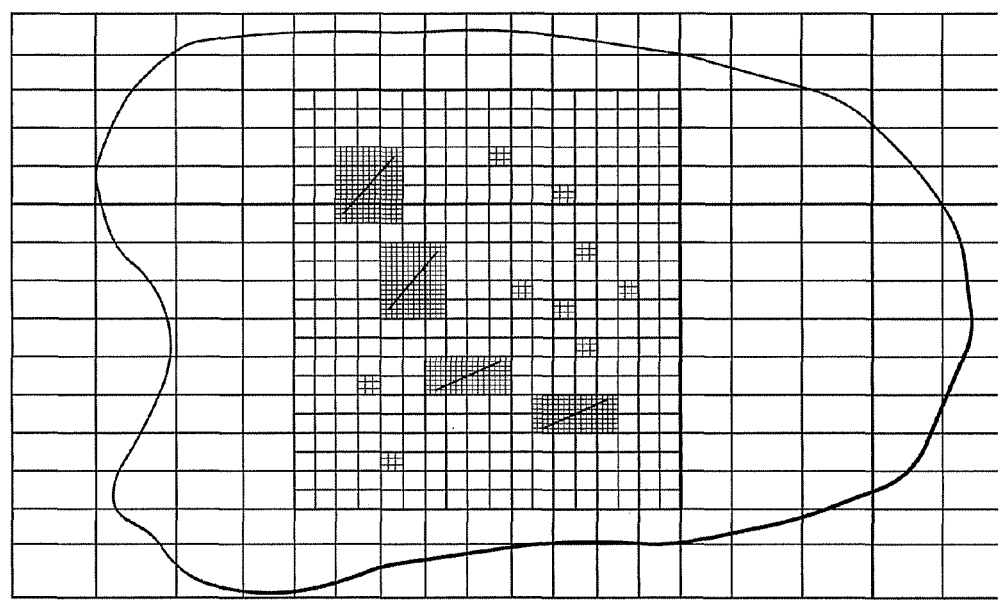
FIG. 7 is a graph depicting local grid refinement of a Cartesian grid according to the prior art.
Figure 13:
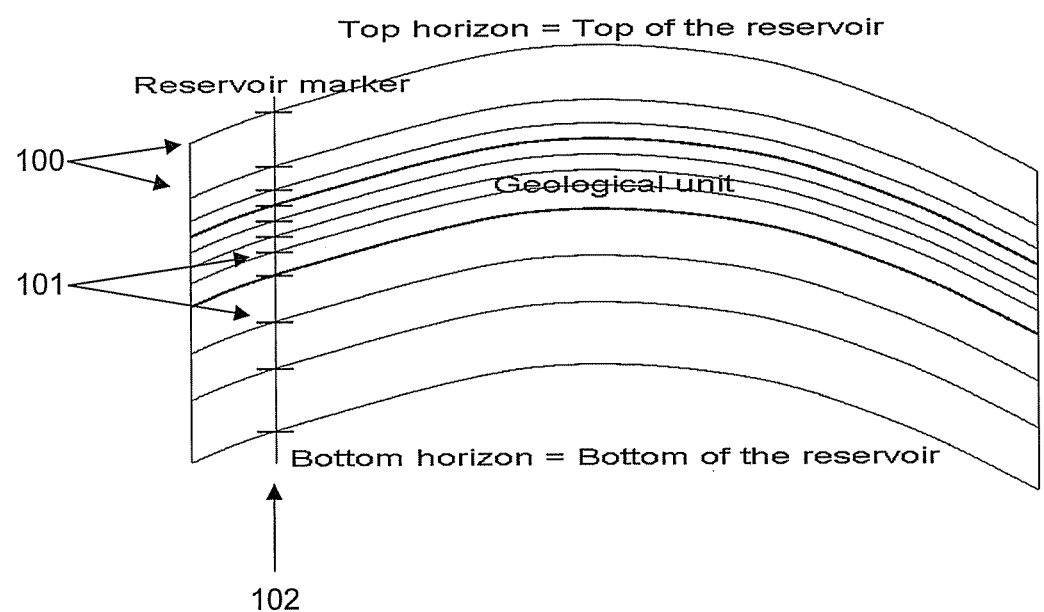
FIG. 13 is a graph showing a plurality of reservoir markers designating the layers of a reservoir generated by a machine, program product and method of an embodiment of the present invention.
Figure 14:
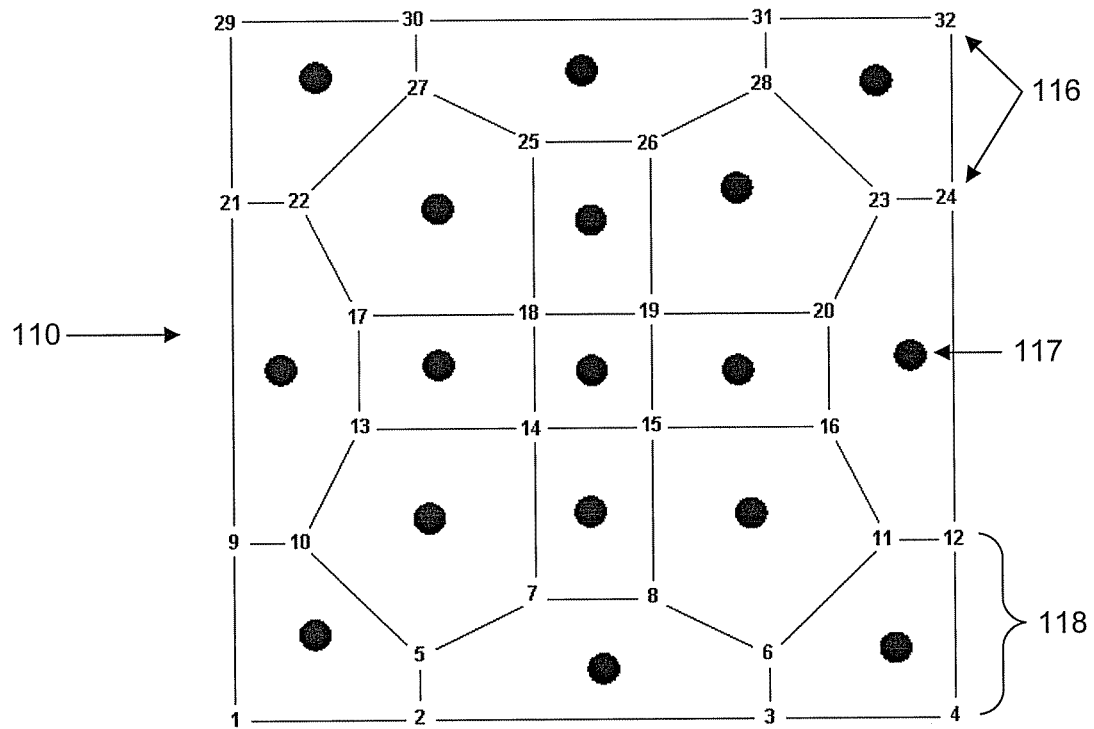
FIG. 14 is a diagram of an unstructured, two-dimensional grid, having cells, edges, faces and vertices, generated using an exemplary embodiment of the invention.
Figure 23:
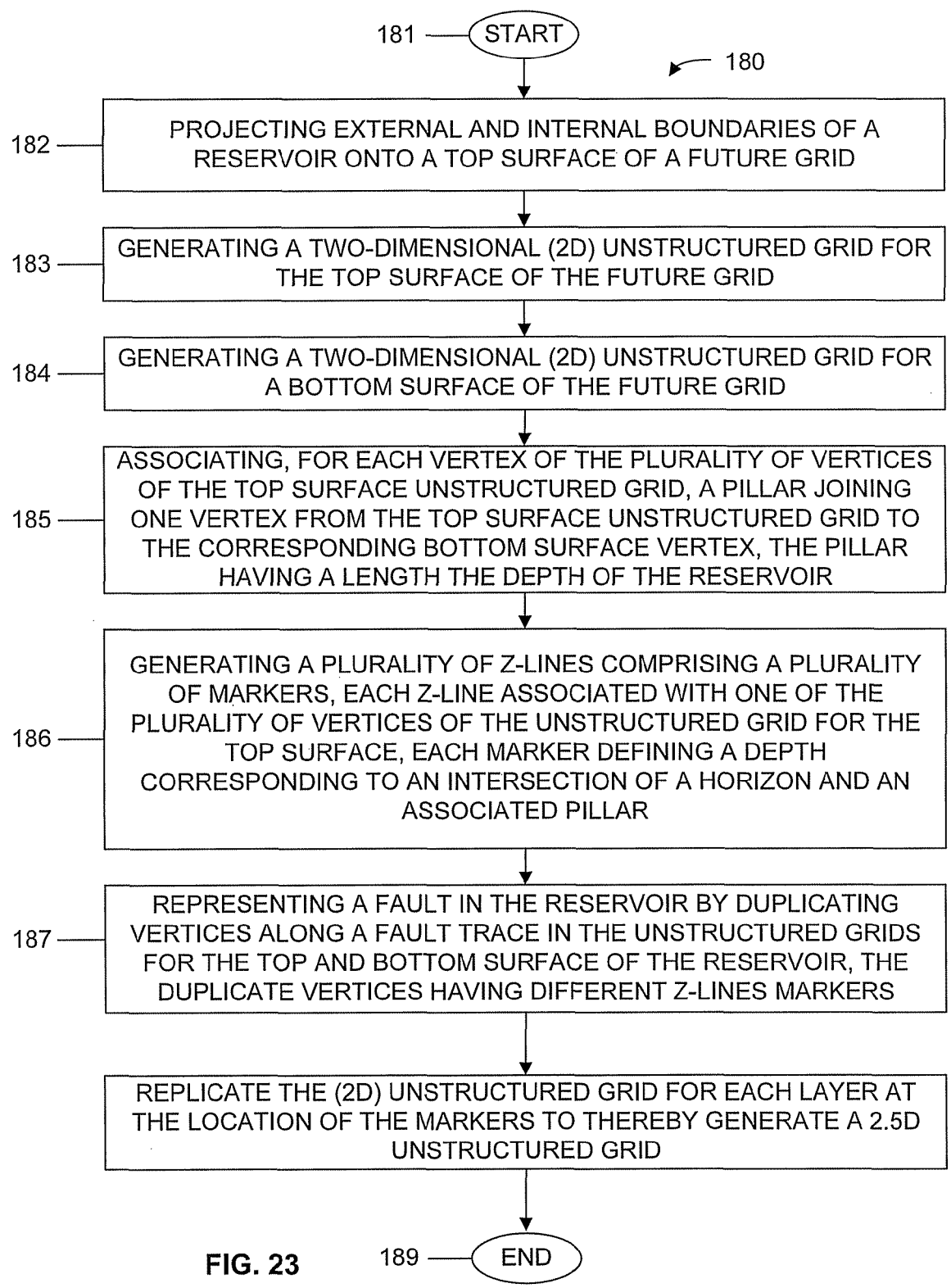
FIG. 23 is a flow chart for a method to generate a grid model for a reservoir according to an embodiment of the present invention.

Embodiments of the present invention can include, for example, a computer-implemented method to model a reservoir 180, as illustrated in FIG. 23. The reservoir can, for example, include a plurality of geological layers delineated by horizons. (See, e.g., FIGS. 9, 12-13). The computer-implemented method 180 can include projecting external and internal boundaries of a reservoir onto a top surface of the future grid (step 182). The external and internal boundaries of a reservoir can any number, e.g., three, of the following: a reservoir extension, an aquifer, a production area, a multilateral well (as illustrated in FIG. 5), and a fault (as illustrated in FIG. 19). The computer-implemented method 180 can include generating a two-dimensional (2D) unstructured grid for the top surface of the future grid (step 183) responsive to a predetermined grid density and the projected external and internal boundaries of the reservoir. The two-dimensional (2D) unstructured grid can include a plurality of contiguous convex polygons defining grid cells, with each grid cell having a cell center and a plurality of vertices. (See, e.g., FIGS. 14 and 15) The computer-implemented method 180 can include generating a two-dimensional (2D) unstructured grid for a bottom surface of the future grid (step 184) responsive to the grid cell centers of the two-dimensional (2D) unstructured grid for the top surface of the future grid and a predetermined translation amount. The two-dimensional (2D) unstructured grid can include a plurality of contiguous convex polygons defining grid cells, with each grid cell having a cell center and a plurality of vertices, so that the bottom surface grid has similar grid cell centers as the top surface grid and so that each vertex of the plurality of vertices of the unstructured grid for the top surface corresponds to one vertex of the plurality of vertices of the unstructured grid for the bottom surface. The computer-implemented method 180 can include associating, for each vertex of the plurality of vertices of the unstructured grid for the top surface, a pillar joining one vertex from the unstructured grid for the top surface to the corresponding bottom surface vertex (step 185). The computer-implemented method 180 can include generating a plurality of z-lines 186. The z-lines can include a plurality of markers. See, e.g., FIG. 13. Each z-line can be associated with one of the plurality of vertices of the unstructured grid for the top surface, and each marker can define a depth corresponding to an intersection of a horizon and an associated pillar (step 186). The unstructured grid can then be replicated for each of the horizons using the markers (step 188) The unstructured grids for the top and bottom surfaces of the reservoir and the associated z-lines can thereby generate a 2.5D unstructured grid to model the reservoir.

Figure 24:
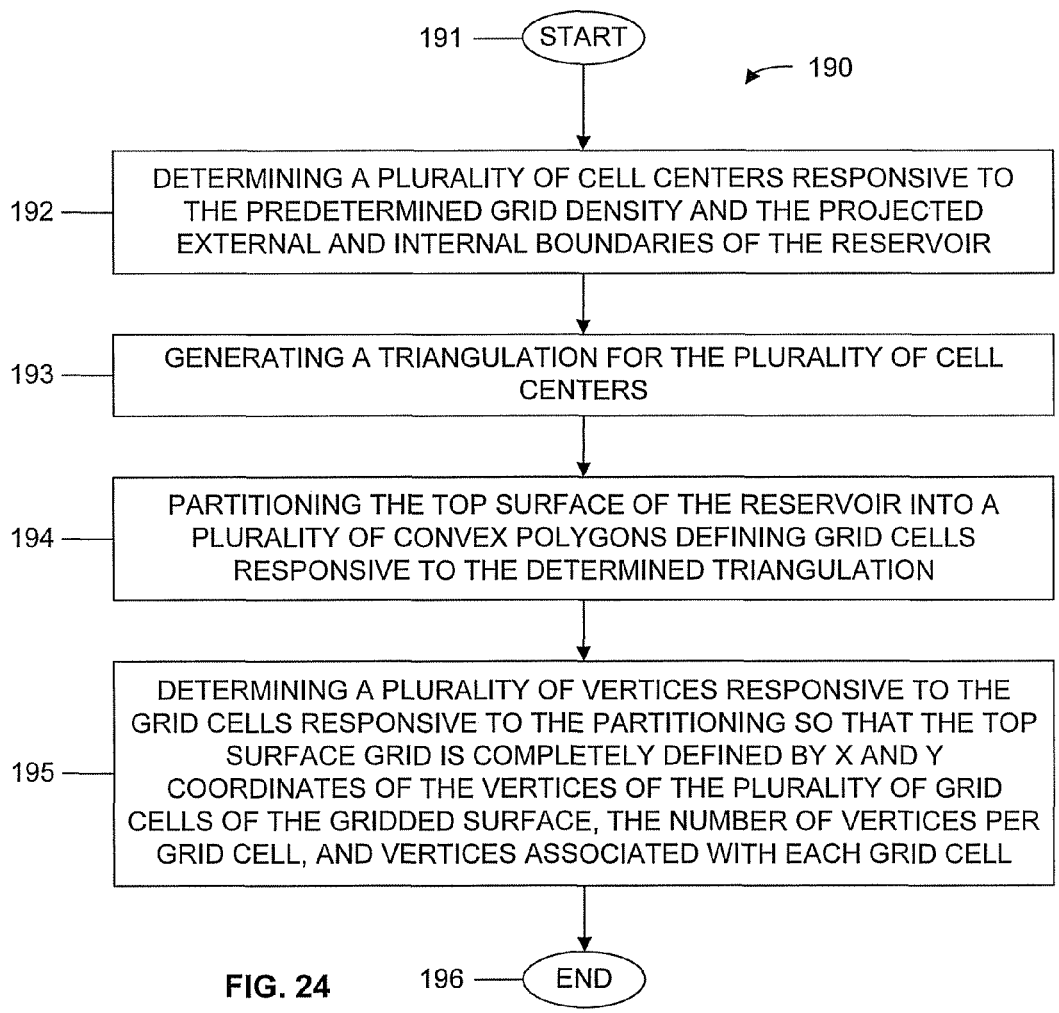
FIG. 24 is a flow chart for a method to generate a two-dimensional (2D) unstructured grid model for a top surface of the reservoir according to an embodiment of the present invention.

According to example embodiments as illustrated in FIG. 24, generating a two-dimensional (2D) unstructured grid for the top surface of the future grid (step 183 in FIG. 23) can further include a computer-implemented method 190. The computer-implemented method 190 can include determining a plurality of cell centers responsive to the predetermined grid density and the projected external and internal boundaries of the reservoir (step 192). The computer-implemented method 190 can include generating a triangulation for the plurality of cell centers (step 193). The computer-implemented method 190 can include partitioning the top surface of the reservoir into a plurality of convex polygons defining grid cells responsive to the determined triangulation (step 194). In example embodiments, the triangulation can be a Delaunay triangulation, and the grid cells can be Voronoi cells. The computer-implemented method 190 can include determining a plurality of vertices responsive to the grid cells responsive to the partitioning so that the top surface grid is completely defined by x and y coordinates of the vertices of the plurality of grid cells of the gridded surface, the number of vertices per grid cell, and vertices associated with each grid cell (step 195).

Applicants recognize the advantages and benefits of Voronoi grids for reservoir simulation, especially in the context of two-dimensional (2D) gridding. Accordingly, in example embodiments of the present invention, generating a two-dimensional (2D) structured grid for the top surface of the future grid involves determining a Voronoi grid. The Voronoi grid can then be the two-dimensional, unstructured grid for the top surface of the future grid that, when combined with an unstructured grid for the bottom surface of the future grid and with z-line embodiments as described herein, generate data structure embodiments to thereby generate the 2.5D unstructured grids to represent, simulate, and visualize the reservoir. Example embodiments further include generating a visual depiction of the data system modeling the reservoir as an unstructured 2.5D grid, as illustrated in FIG. 25.

Figure 25:
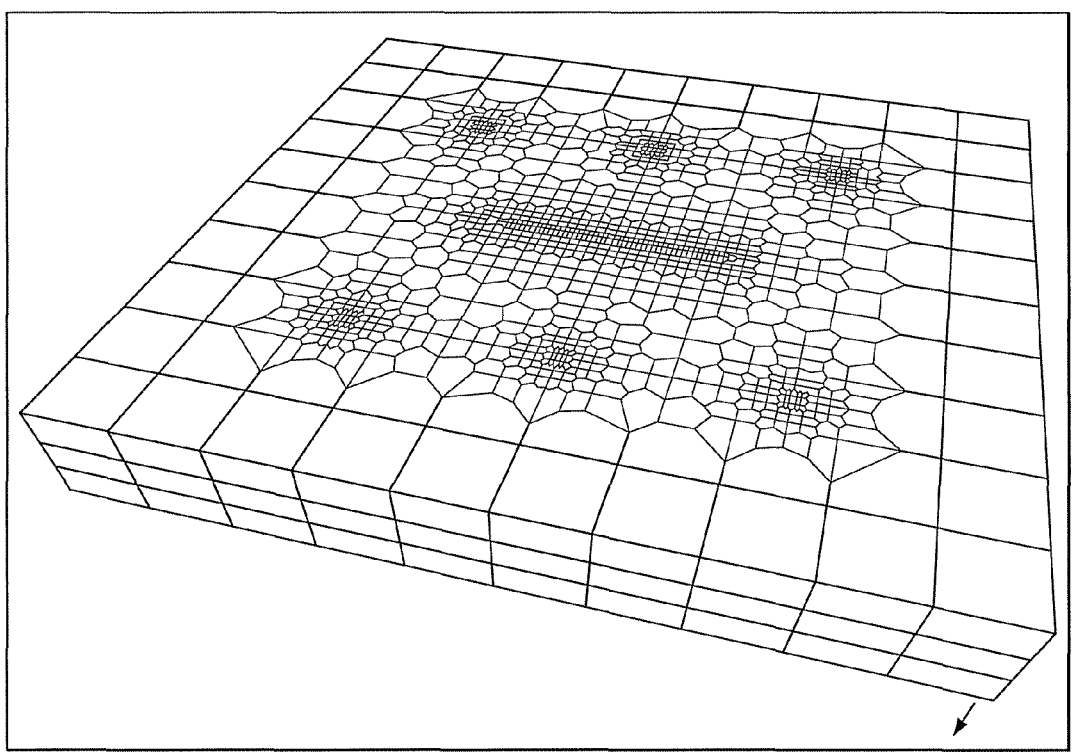
FIG. 25 is an example of a 2.5D unstructured grid according to a data system embodiment of the present invention.

FIG. 25 further illustrates an exemplary 2.5D grid, to model a reservoir, generated using the machine, computer program product, and methods of an embodiment of the invention. Advantageously, embodiments of the present invention can include, for example, orders of magnitude fewer data points to describe a reservoir than a traditional three-dimensional (3D) structured grid or hybrid structured-unstructured grid as understood by those skilled in the art. That is, embodiments of the present invention can include datasets sized significantly less than those of a traditional solution. As understood by those skilled in the art, fewer data points result in reduced computation resources, including time and processing power. In addition, a memory requirement to store a 2.5D unstructured grid modeling the geometry of a reservoir according to an embodiment of the present invention can be significantly less than the memory requirement to store a fully three-dimensional (3D) grid of the reservoir.

A person having ordinary skill in the art will recognize that various types of computing devices and computer architectures are described herein by way of example and other computing apparatuses and networks could be configured to implement or perform the machine, program products and methods described herein, including, for example, laptops, desktops, distributed computing, cloud computing, data centers, mobile and handheld devices, and other systems, are embodiments of the present invention, and these embodiments are intended to be included within the scope of the appended claims.

Although the present invention has been described in detail, it should be understood that various changes, substitutions, and alterations could be made hereupon without departing from the principle and scope of the invention. Accordingly, the scope of the present invention should be determined by the following claims and their appropriate legal equivalents. The singular forms "a", "an" and "the" include plural referents, unless the context clearly dictates otherwise. Optional or optionally means that the subsequently described event or circumstances may or may not occur. The description includes instances where the event or circumstance occurs and instances where it does not occur. Ranges may be expressed herein as from about one particular value, and/or to about another particular value. When such a range is expressed, it is to be understood that another embodiment is from the one particular value and/or to the other particular value, along with all combinations within said range. Throughout this application, where patents or publi- That claimed is:

1. A machine adapted to generate data for oil reservoir simulations, the machine comprising:
   a first computer server associated with a data pre-processor defining a pre-processing server, the pre-processing server having a processor and non-transitory memory and being adapted to send and receive data;
   a second computer server associated with computer storage and defining a file server; the file server having non-transitory file server memory and being adapted to send and receive data; and
   a computer program product stored on the memory of the pre-processing server and including instructions that when executed by the processor cause the pre-processing server to perform a process of generating a grid and a process of encoding the grid to be stored on the file server, the instructions comprising the steps of:
      projecting static properties of a reservoir, including external and internal boundaries, onto a top surface of a future grid,
      constructing a 2D unstructured grid along the top surface of the future grid using static properties of the reservoir, the 2D unstructured grid having cells and the cells having vertexes defining the cell boundaries,
      reconstructing the 2D unstructured grid along a bottom surface of the future grid;
      constructing a vertical line having a thickness of the reservoir through the future grid, to join the corresponding vertexes in the 2D unstructured grids on the top and bottom surfaces;
      creating markers along the vertical line, the markers corresponding to each layer in the reservoir and being defined using a location of each layer's horizon;
      duplicating vertexes on the top and bottom layers when a vertical fault line is to be modeled, the duplicated vertexes generating parallel vertical lines, and the parallel vertical lines having different markers thereon;
      copying the 2D, unstructured grid created for the top layer to each reservoir layer, the 2D unstructured grid being located at each marker to thereby create a 2.5 D grid; and
      assigning each grid cell vertex and each grid cell an index and storing each grid cell and grid cell index in memory using compressed sparse row format.

2. A data system of claim 1, wherein a memory requirement to store the 2.5D unstructured grid modeling the geometry of the reservoir is at least an order of magnitude less than a memory requirement to store a fully three-dimensional (3D) grid of the reservoir.

3. A machine of claim 1, wherein the one or more static properties of the reservoir include one or more of the following: a porosity value, a permeability value, and a rock type; and wherein one or more dynamic properties of the reservoir include one or more of the following: a pressure value, a temperature value, and a saturation value.

4. A machine of claim 1, wherein the 2.5D grid comprises a Cartesian grid, a Cartesian grid with local grid refinement, a corner point geometry grid, or a radial grid.

5. A machine of claim 1, further comprising:
   a plurality of application servers, each defining a processing node for running a computer simulation of a reservoir using the 2.5D grid generated by the pre-processing server and stored on the file server, the application servers outputting simulation maps, well output and well performance data as simulation results; and
   a post-processing server defining a post processor for assembling a processing simulation results for display to a user.

6. A machine of claim 5, wherein the post-processing server generates a 2.5 D visualization of the grid, performs well plot analyses and analyzes the simulation results as compared to historical simulation results.

7. A computer program product, stored in non-transitory computer memory, operable on a computer, the computer program product comprising a set of instructions that, when executed by the computer, cause the computer to perform a process of generating a grid and a process of encoding the grid to be stored on the file server, the instructions comprising the steps of:
   projecting static properties of a reservoir, including external and internal boundaries, onto a top surface of a future grid,
   constructing a 2D unstructured grid along the top surface of the future grid using static properties of the reservoir, the 2D unstructured grid having cells and the cells having vertexes defining the cell boundaries,
   reconstructing the 2D unstructured grid along a bottom surface of the future grid;
   constructing a vertical line having a thickness of the reservoir through the future grid, to join the corresponding vertexes in the 2D unstructured grids on the top and bottom surfaces;
   creating markers along the vertical line, the markers corresponding to each layer in the reservoir and being defined using a location of each layer's horizon;
   duplicating vertexes on the top and bottom layers when a vertical fault line is to be modeled, the duplicated vertexes generating parallel vertical lines, and the parallel vertical lines having different markers thereon;
   copying the 2D, unstructured grid created for the top layer to each reservoir layer, the 2D unstructured grid being located at each marker, to thereby create a 2.5D grid; and
   assigning each grid cell vertex and each grid cell an index and storing each grid cell and grid cell index in memory using compressed sparse row format.

8. A computer program product of claim 7, wherein the one or more static properties of the reservoir include one or more of the following: a porosity value, a permeability value, and a rock type; and wherein one or more dynamic properties of the reservoir include one or more of the following: a pressure value, a temperature value, and a saturation value.

9. A computer program product of claim 7, further comprising the step of:
   calculating grid geometry properties, including grid cell to grid cell connection factors to thereby determine transmissibility and including a grid cell to well completion connection factor to thereby determine a well productivity index.

10. A computer program product of claim 7, further comprising the step of:
    generating a subset of a plurality of vertical lines wherein each vertical line in the subset has one or more identical adjacent horizon depths to represent a merged geological layer and thereby model a pinch-out.

11. A computer program product of claim 7, wherein the 2.5D grid comprises a Cartesian grid, a Cartesian grid with local grid refinement, a corner point geometry grid, or a radial grid.

12. A computer program product of claim 7, wherein the computer program product outputs grid geological properties, grid well perforation data, model data and well history data.

13. A computer program product of claim 7, wherein generating a two-dimensional (2D) unstructured grid for the top surface of the reservoir further comprises the steps of:
    determining a plurality of cell centers responsive to a predetermined grid density and the projected external and internal boundaries of the reservoir;
    generating a triangulation for the plurality of cell centers;
    partitioning the top surface of the reservoir into a plurality of convex polygons defining grid cells responsive to the determined triangulation;
    determining a plurality of vertices responsive to the grid cells responsive to the partitioning so that the top surface grid is completely defined by x and y coordinates of the vertices of the plurality of grid cells of the gridded surface, the number of vertices per grid cell, and vertices associated with each grid cell.

14. A computer-implemented method for causing a computer as a pre-processing server to perform a process of generating a grid and a process of encoding the grid, the instructions comprising the steps of:
    projecting static properties of a reservoir, including external and internal boundaries, onto a top surface of a future grid,
    constructing a 2D unstructured grid along the top surface of the future grid using static properties of the reservoir, the 2D unstructured grid having cells and the cells having vertexes defining the cell boundaries,
    reconstructing the 2D unstructured grid along a bottom surface of the future grid;
    constructing a vertical line a thickness of the reservoir through the future grid, to join the corresponding vertexes in the 2D unstructured grids on the top and bottom surfaces;
    creating markers along the vertical line, the markers corresponding to each layer in the reservoir and being defined using a location of each layer's horizon;
    duplicating vertexes on the top and bottom layers when a vertical fault line is to be modeled, the duplicated vertexes generating parallel vertical lines, and the parallel vertical lines having different markers thereon;
    copying the 2D, unstructured grid created for the top layer to each reservoir layer, the 2D unstructured grid being located at each marker, to thereby create a 2.5D grid; and
    assigning each grid cell vertex and each grid cell an index and storing each grid cell and grid cell index in memory using compressed sparse row format.

15. A computer-implemented method of claim 14, wherein generating a two-dimensional (2D) unstructured grid for the top surface of the reservoir further comprises the steps of:
    determining a plurality of cell centers responsive to a predetermined grid density and the projected external and internal boundaries of the reservoir;
    generating a triangulation for the plurality of cell centers;
    partitioning the top surface of the reservoir into a plurality of convex polygons defining grid cells responsive to the determined triangulation;
    determining a plurality of vertices responsive to the grid cells responsive to the partitioning so that the top surface grid is completely defined by x and y coordinates of the vertices of the plurality of grid cells of the gridded surface, the number of vertices per grid cell, and vertices associated with each grid cell.

16. A computer-implemented method of claim 15, wherein the triangulation is a Delaunay triangulation, and wherein the grid cells are Voronoi cells.

17. A computer-implemented method of claim 14, wherein generating a plurality of vertical lines further includes generating a subset of the plurality of vertical lines wherein each vertical line in the subset has one or more identical adjacent markers to represent a merged geological layer to thereby model a pinch-out or a coarsening.

18. A computer-implemented method of claim 14, further comprising:
    representing a fault in the reservoir by duplicating vertices along a fault trace in the unstructured grids for the top and bottom surface of the reservoir, the duplicate vertices having different z-lines markers.

19. A computer-implemented method of claim 14, wherein the external and internal boundaries of a reservoir including three or more of the following: a reservoir extension, an aquifer, a production area, a multi-lateral well, and a fault.

20. A computer-implemented method of claim 14, wherein the 2.5D grid comprises a Cartesian grid, a Cartesian grid with local grid refinement, a corner point geometry grid, or a radial grid.

* * * * *